US011506757B2

United States Patent
Murakami

(10) Patent No.: US 11,506,757 B2
(45) Date of Patent: Nov. 22, 2022

(54) PROJECTION OPTICAL SYSTEM AND RADAR DEVICE

(71) Applicant: Panasonic Intellectual Property Management Co., Ltd., Osaka (JP)

(72) Inventor: Kimihiro Murakami, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 17/673,413

(22) Filed: Feb. 16, 2022

(65) Prior Publication Data

US 2022/0171029 A1    Jun. 2, 2022

Related U.S. Application Data

(63) Continuation of application No. PCT/JP2020/024120, filed on Jun. 19, 2020.

(30) Foreign Application Priority Data

Sep. 19, 2019 (JP) .............................. JP2019-170835

(51) Int. Cl.
*G01S 7/48* (2006.01)
*G01S 7/481* (2006.01)
(Continued)

(52) U.S. Cl.
CPC ............ *G01S 7/4814* (2013.01); *G01S 7/484* (2013.01); *G01S 17/08* (2013.01); *G03B 21/2033* (2013.01); *H01S 5/18361* (2013.01)

(58) Field of Classification Search
CPC ........ G01S 7/4814; G01S 7/484; G01S 17/08; G01S 7/4815; G01S 17/10;
(Continued)

(56) References Cited

U.S. PATENT DOCUMENTS 7,226,197 B2 * 6/2007 Hayashi ............... G02B 6/0038
                                                        362/330
9,880,264 B2 * 1/2018 Nakamura ......... G02B 27/0927
(Continued)

FOREIGN PATENT DOCUMENTS

JP    2004-006326 A    1/2004
JP    2007-096318 A    4/2007
(Continued)

OTHER PUBLICATIONS

International Search Report issued in corresponding International Patent Application No. PCT/JP2020/024120, dated Aug. 11, 2020, with English translation.

*Primary Examiner* — Roy M Punnoose
(74) *Attorney, Agent, or Firm* — McDermott Will & Emery LLP

(57) ABSTRACT

A projection optical system includes: a surface-emitting light source configured to emit light at an intensity in a Gaussian distribution; and an optical element configured to perform uniformization, at least in one direction and in a range of a projection angle, of the intensity of the light emitted from the surface-emitting light source. In the optical element, an incident surface on which the light is incident is sectioned into a plurality of regions having refractive actions different from each other, and among the plurality of regions, at least outermost regions on which outer edge portions, of the light, in the direction in which the uniformization is performed are incident, are planes that are each tilted, from a state of being parallel to a light emitting surface of the surface-emitting light source, to the direction in which the uniformization is performed.

18 Claims, 13 Drawing Sheets

(51) Int. Cl.
    *G01S 7/484*    (2006.01)
    *G01S 17/08*    (2006.01)
    *G03B 21/20*    (2006.01)
    *H01S 5/183*    (2006.01)

(58) Field of Classification Search
    CPC ............ G03B 21/2033; H01S 5/18361; G02B 27/0927; G02B 27/095
    See application file for complete search history.

(56) References Cited

U.S. PATENT DOCUMENTS

| | | |
|---|---|---|
| 2005/0174803 A1 | 8/2005 | Hayashi et al. |
| 2007/0070530 A1 | 3/2007 | Seo et al. |
| 2010/0002465 A1 | 1/2010 | Tsang et al. |
| 2014/0034817 A1* | 2/2014 | Nakamura ............ G02B 26/123 250/221 |
| 2015/0124238 A1* | 5/2015 | Sakai ...................... G01S 7/484 356/4.01 |
| 2015/0160341 A1* | 6/2015 | Akatsu ................. H05B 47/115 356/23 |
| 2016/0097843 A1 | 4/2016 | Nakamura |

FOREIGN PATENT DOCUMENTS

| | | |
|---|---|---|
| JP | 2010-016367 A | 1/2010 |
| JP | 2013-164964 A | 8/2013 |
| JP | 2015-099205 A | 5/2015 |
| JP | 2016-075564 A | 5/2016 |
| JP | 2016-085797 A | 5/2016 |
| JP | 2019-009108 A | 1/2019 |

* cited by examiner

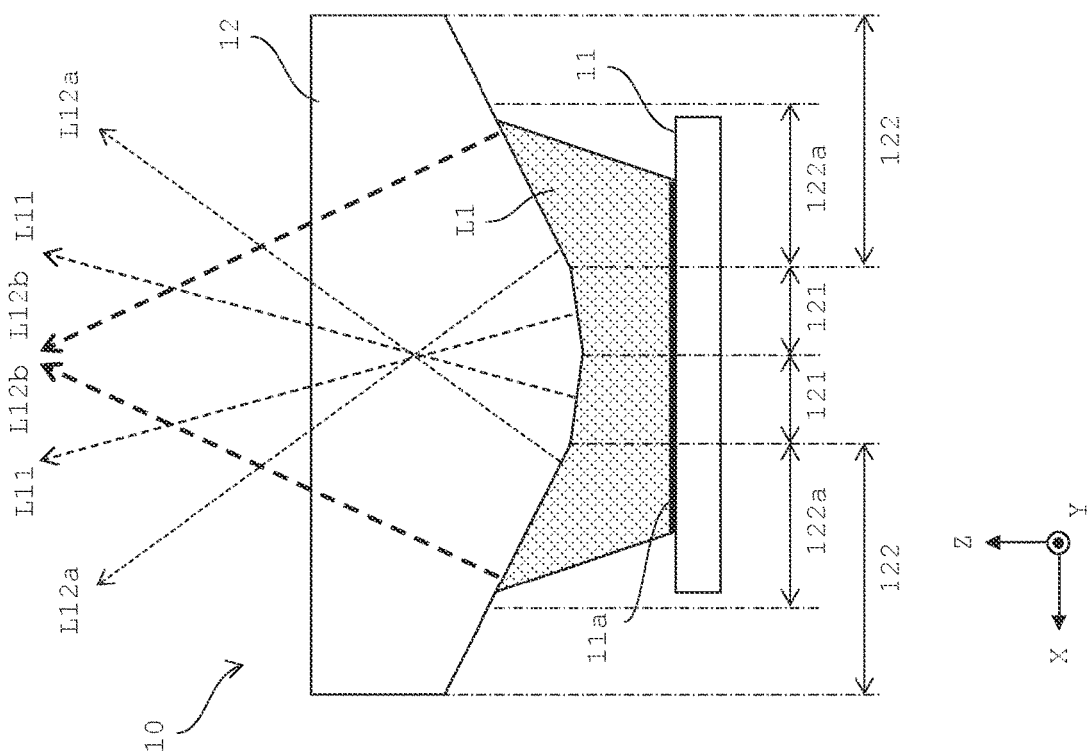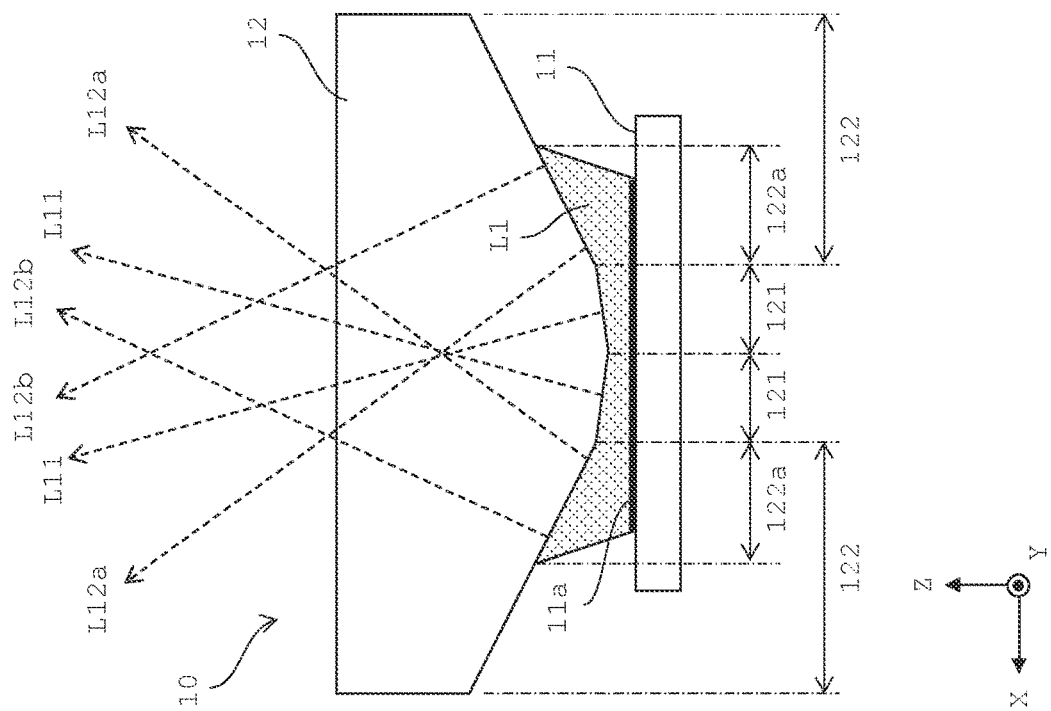

PROTRUDING INCIDENT SURFACE

RECESSED INCIDENT SURFACE

PROJECTION OPTICAL SYSTEM AND RADAR DEVICE

CROSS REFERENCE TO RELATED APPLICATION

This application is a continuation of International Application No. PCT/JP2020/024120 filed on Jun. 19, 2020, entitled "PROJECTION OPTICAL SYSTEM AND RADAR DEVICE", which claims priority under 35 U.S.C. Section 119 of Japanese Patent Applications No. 2019-170835 filed on Sep. 19, 2019, entitled "PROJECTION OPTICAL SYSTEM AND RADAR DEVICE". The disclosure of the above application is incorporated herein by reference.

BACKGROUND OF THE INVENTION

1. Field of the Invention

The present invention relates to a projection optical system that projects light, and a radar device using the projection optical system.

2. Disclosure of Related Art

A radar device that projects light to a front region and, on the basis of reflection light thereof, detects an object present in the front region is known. In a radar device of this type, light is projected in a predetermined spread angle in the horizontal direction, for example. In this case, it is preferable that an object can be uniformly detected in the entire range of the spread angle. Therefore, in the radar device of this type, a projection optical system for uniformizing the intensity distribution of light in a substantially entire range of the spread angle is used.

Japanese Laid-Open Patent Publication No. 2016-75564 describes a projection optical system in which a prism-shaped optical element is disposed to the front of a laser diode, thereby widening the spread angle of laser light emitted from a laser diode and, at the same time, uniformizing the intensity distribution.

In the radar device described above, if the amount of projection light is increased, the distance for which object detection is possible can be increased. In this case, if a surface-emitting light source is used, the amount of projection light can be increased.

However, when a surface-emitting light source is used in the configuration described above, the light emitting region of the light source is increased from that of a point light source, and thus, light is incident from a wide range outside the optical axis of the optical element. Accordingly, the intensity at the vicinities of the boundaries of the spread angle cannot be steeply raised to a uniform intensity due to the influence of off-axis components with respect to the optical element.

As a method for solving this problem, it is possible to use a method in which the distance between the surface-emitting light source and the optical element is increased to an extent that the surface-emitting light source can be considered as a point light source. However, in this method, since light having been greatly spread is incident on the optical element, the size of the optical element is increased, resulting in an increased size of the radar device.

SUMMARY OF THE INVENTION

A first mode of the present invention relates to a projection optical system. The projection optical system according to the present mode includes: a surface-emitting light source configured to emit light at an intensity similar to that of a Gaussian distribution; and an optical element configured to perform uniformization, at least in one direction and in a range of a projection angle, of the intensity of the light emitted from the surface-emitting light source. Here, in the optical element, an incident surface on which the light is incident is sectioned, in the direction in which the uniformization is performed, into a plurality of regions having refractive actions different from each other, and, among the plurality of regions, at least an outermost regions, on which outer edge portions, of the light, in the direction in which the uniformization is performed are incident, are planes that are each tilted, from a state of being parallel to a light emitting surface of the surface-emitting light source, to the direction in which the uniformization is performed.

The light incident on the outermost regions on the outermost side among the plurality of regions set in the incident surface of the optical element forms the outer edges of the projection light after having been transmitted through the optical element. Since the outermost regions are each implemented as a plane, the intensity distributions on the lateral sides of the intensity distributions (intensity distribution similar to a Gaussian distribution) of the light incident on the outermost regions can be reflected in the intensity distribution at the outer edges of the projection light. Accordingly, the intensity distribution at the outer edges of the projection light can be suppressed from becoming moderate. Thus, in the vicinities of the boundaries of the spread angle of the projection light, the intensity of the projection light can be steeply increased to a uniform intensity. As a result, the range of the uniform intensity can be widened.

A second mode of the present invention relates to a radar device. The radar device according to the present mode includes: the projection optical system according to the first mode; and a light-receiving optical system configured to receive reflection light resultant from reflection, by an object, of projection light projected from the projection optical system.

Since the radar device according to the second mode includes the projection optical system according to the first mode, the angle range in which projection light is projected in a uniform intensity distribution can be widened. Therefore, accuracy of object detection can be increased.

The effects and the significance of the present invention will be further clarified by the description of the embodiment below. However, the embodiment below is merely an example for implementing the present invention. The present invention is not limited by the description of the embodiment below in any way.

BRIEF DESCRIPTION OF THE DRAWINGS

FIG. 11A schematically shows how the projection light is refracted by an optical element when the distance between the surface-emitting light source and the optical element is set to a predetermined distance according to the embodiment;

FIG. 11B schematically shows how the projection light is refracted by the optical element when the distance between the surface-emitting light source and the optical element has been increased from the predetermined distance according to the embodiment;

It should be noted that the drawings are solely for description and do not limit the scope of the present invention by any degree.

DESCRIPTION OF PREFERRED EMBODIMENTS

Hereinafter, an embodiment of the present invention will be described with reference to the drawings. For convenience, each drawing is provided with X, Y, Z axes orthogonal to one another. An X-axis direction, a Y-axis direction, and a Z-axis direction are the width direction, the height direction, and the front-rear direction of a radar device 1, respectively. The radar device 1 emits projection light in a Z-axis positive direction.

Figure 1:
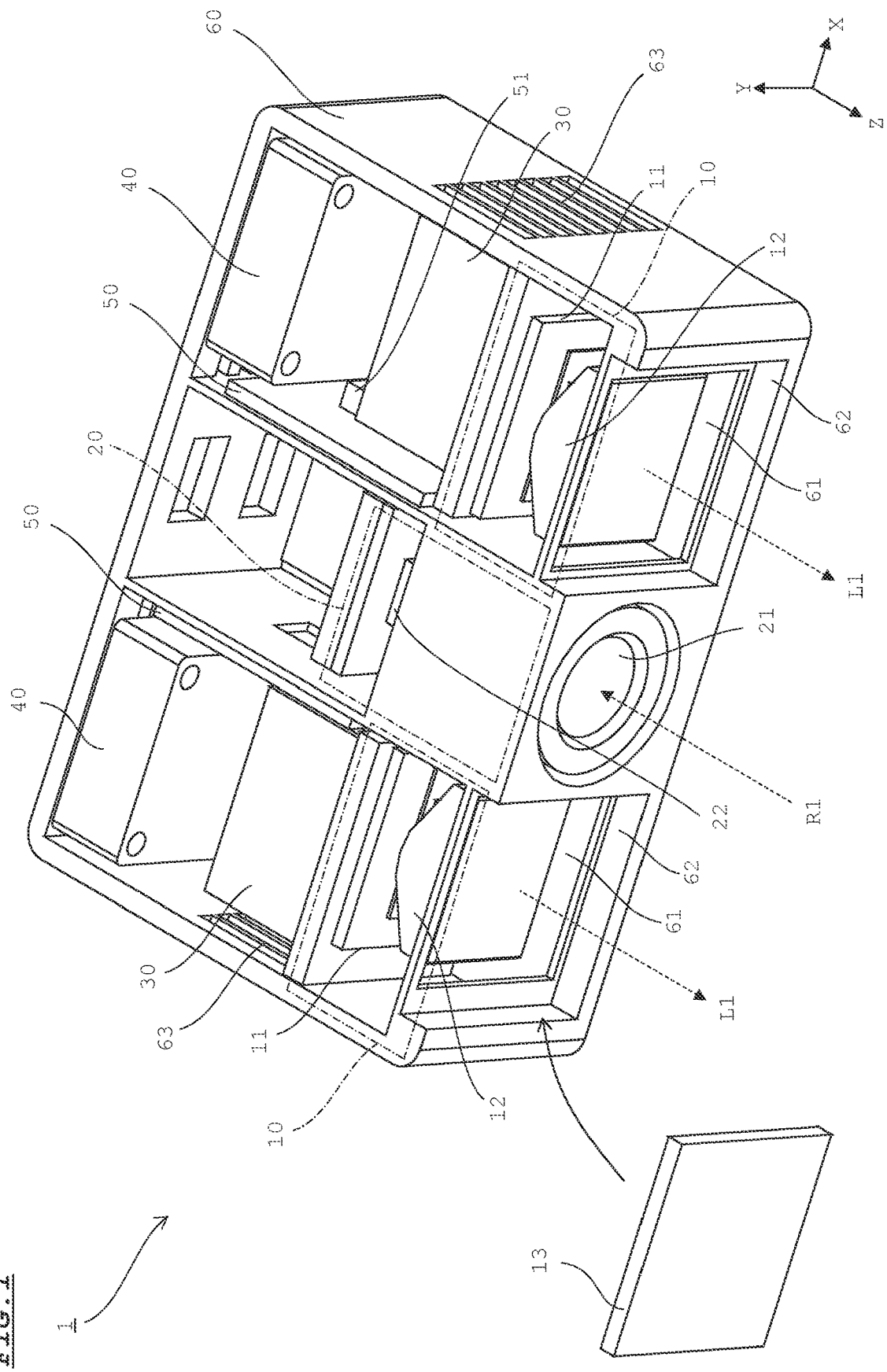
FIG. 1 is a perspective view showing a configuration of a radar device according to an embodiment.

FIG. 1 is a perspective view showing a configuration of the radar device 1. FIG. 1 shows the radar device 1 in a state where an upper face cover has been removed.

The radar device 1 includes two projection optical systems 10, a light-receiving optical system 20, two heat sinks 30, two cooling fans 40, two circuit boards 50, and a housing 60. The housing 60 is in a rectangular parallelepiped shape, and has, inside thereof, a space that houses components of the radar device 1.

Each projection optical system 10 includes a surface-emitting light source 11, an optical element 12, and a window member 13. The surface-emitting light source 11 emits, in the Z-axis direction from a rectangular light emitting region, projection light L1 having a predetermined wavelength in an intensity distribution of a Gaussian distribution (intensity distribution of far field). The surface-emitting light source 11 emits the projection light L1 in an infrared waveband, for example. The optical element 12 widens, in the X-axis direction, the projection angle of the projection light L1 emitted from the surface-emitting light source 11, and uniformizes the intensity distribution of the projection light L1 in the X-axis direction. The window member 13 is a translucent member, and is attached to a frame part 62 at the front face of the housing 60 so as to close a passage hole 61, for the projection light L1, formed in the housing 60. The window member 13 may be a filter that selectively allows the waveband of the projection light L1 to be transmitted therethrough.

In the configuration shown in FIG. 1, two projection optical systems 10 are disposed so as to sandwich the light-receiving optical system 20 in the X-axis direction. The configurations of the two projection optical systems 10 are the same. Projection lights L1 respectively projected from the two projection optical systems 10 overlap each other in front of the light-receiving optical system 20. The projection region where these projection lights L1 overlap each other is in a substantially rectangular shape that is long in the X-axis direction.

The light-receiving optical system 20 includes a condenser lens 21 and a light detector 22. The condenser lens 21 condenses reflection light R1 of each projection light L1 reflected by an object that is present to the front of the radar device 1, onto a light-receiving surface of the light detector 22. The condenser lens 21 need not necessarily be a single lens, and may be formed by a plurality of lenses being combined. The light-receiving optical system 20 may include a filter that allows only the waveband of the projection light L1 to be transmitted therethrough. Alternatively, when the waveband of the projection light L1 is included in an infrared waveband, the light detector 22 may be configured to have detection sensitivity only for the infrared waveband.

The light detector 22 is configured such that a plurality of pixels (optical sensors) are arranged vertically and horizontally. For example, a two-dimensional APD array in which an APD (avalanche photodiode) is disposed at each pixel is used as the light detector 22. Alternatively, a two-dimensional SPAD array in which an SPAD (single-photon avalanche diode) is disposed at each pixel may be used as the light detector 22.

Each heat sink 30 radiates heat generated in the corresponding surface-emitting light source 11. The surface-emitting light source 11 is provided at the front face of the heat sink 30. Each cooling fan 40 takes in air from the rear face of the housing 60. The air taken in by the cooling fan 40 is circulated in the housing 60, to be exhausted from an exhaust port 63 at a side face of the housing 60. When air is circulated in the housing 60, heat of the heat sink 30 moves to the air. Accordingly, the surface-emitting light source 11 is cooled. It should be noted that, with the component 63 used as an intake port, air for cooling may be circulated in a reverse direction, to be discharged from the cooling fan 40.

The two circuit boards 50 have mounted thereon drive circuits for driving the surface-emitting light sources 11 and the cooling fans 40 on the left side and the right side, respectively. A control circuit 51 for performing control for object detection may be mounted on one of the two circuit boards 50. The control circuit 51 may be mounted to another circuit board.

During object detection, the control circuit 51 causes the two surface-emitting light sources 11 to emit light in a pulsed manner. Then, the control circuit 51 refers to a detection signal from each pixel of the light detector 22 and determines whether or not the reflection light R1 has been received at each pixel. The control circuit 51 determines that an object is present at a position, in the projection region of the projection light L1, that corresponds to the pixel that has received the reflection light R1. The control circuit 51 may calculate the distance to the object on the basis of the time difference between the light emission timing of each surface-emitting light source 11 and the light reception timing of the reflection light R1.

Figure 2A:
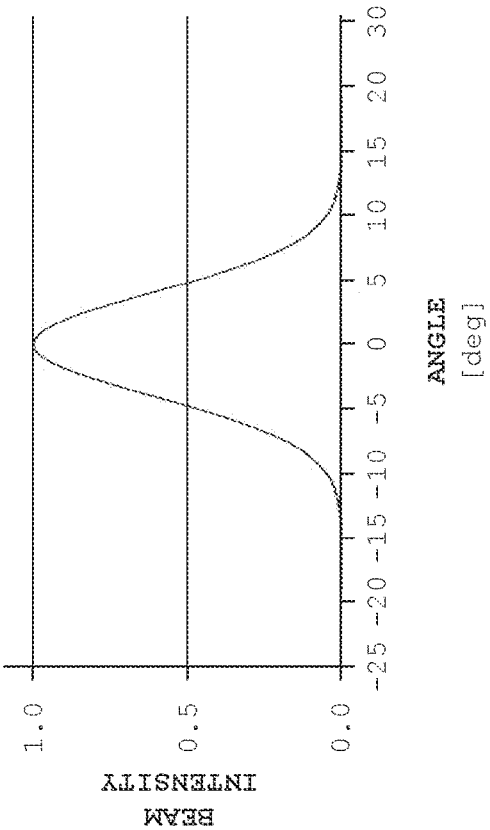
FIG. 2A is a perspective view schematically showing a configuration of a surface-emitting light source according to the embodiment.
Figure 2C:
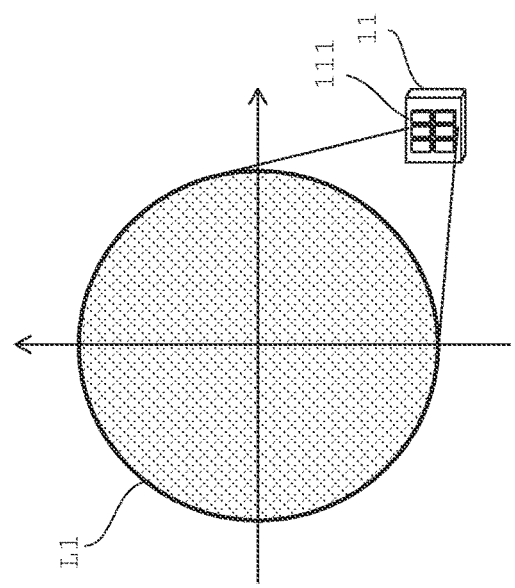
FIG. 2C shows the intensity distribution of projection light in a far field according to the embodiment.
Figure 2B:
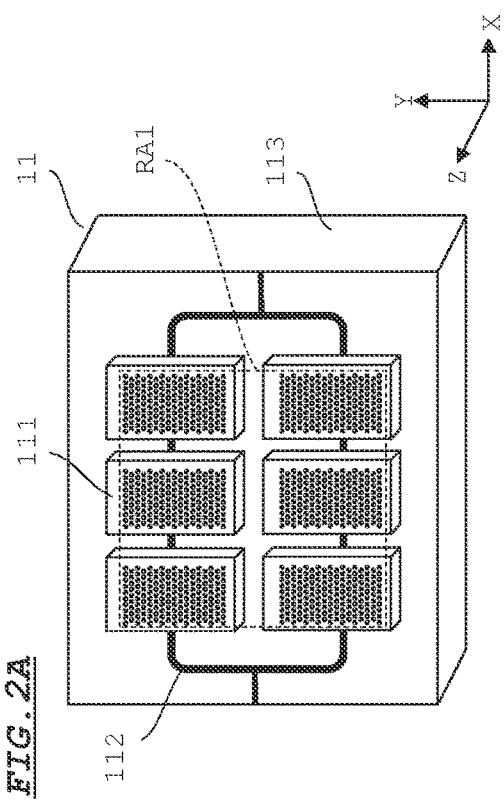
FIG. 2B is a perspective view schematically showing a configuration of a light emitting unit according to the embodiment.

FIG. 2A is a perspective view schematically showing a configuration of the surface-emitting light source 11. FIG. 2B is a perspective view schematically showing a configuration of a light emitting unit 111.

As shown in FIG. 2A, the surface-emitting light source 11 includes a plurality of light emitting units 111. Here, six light emitting units 111 are provided to a base 113. The number of light emitting units 111 is not limited to 6. The respective light emitting units 111 are connected by wiring 112 to be supplied with power. The connection between the light emitting units 111 may be series connection or may be parallel connection.

As shown in FIG. 2B, each light emitting unit 111 is configured such that a large number of light sources 111a are evenly disposed in a light emitting region RA2 of the upper face of a base 111b, and the respective light sources 111a are in a state of being electrically wired in series or in parallel. Each light source 111a is a vertical cavity surface emitting Laser (VCSEL). The light source 111a may be a light source other than a VCSEL. For example, the light source 111a may be an LED (Light Emitting Diode). Each light source 111a emits light L0 in a Gaussian distribution that is in symmetry with respect to the emission optical axis. The intensity distribution of the light source 111a is the same in any radial direction about the emission optical axis.

In general, an LED has a larger light emitting area than a VCSEL. Therefore, for example, the light emitting unit 111 or the surface-emitting light source 11 may be implemented as a single LED, not as an array of LEDs. That is, when the light source 111a is an LED, a single LED having a light emitting area that is substantially the same as that of the light emitting region of the surface-emitting light source 11 may be disposed in the light emitting region of the surface-emitting light source 11, or two or more LEDs that each have a light emitting area smaller than the light emitting region of the surface-emitting light source 11 may be evenly disposed in the light emitting region of the surface-emitting light source 11.

As shown in FIG. 2A, the six light emitting units 111 are integrated, whereby the surface-emitting light source 11 which has a light emitting region RA1 as the surface-emitting region is configured. As for the light emitting region RA1, for example, the vertical side and the horizontal side are several mm to several 10 mm. The light sources 111a are substantially evenly disposed in the light emitting region RA1. The light emitting unit 111 may be disposed so as to be arranged only in the X-axis direction in a one-dimensional manner, to configure the surface-emitting light source 11. Alternatively, a configuration in which the light sources 111a are arranged only in the X-axis direction in a one-dimensional manner may be adopted.

Figure 2D:
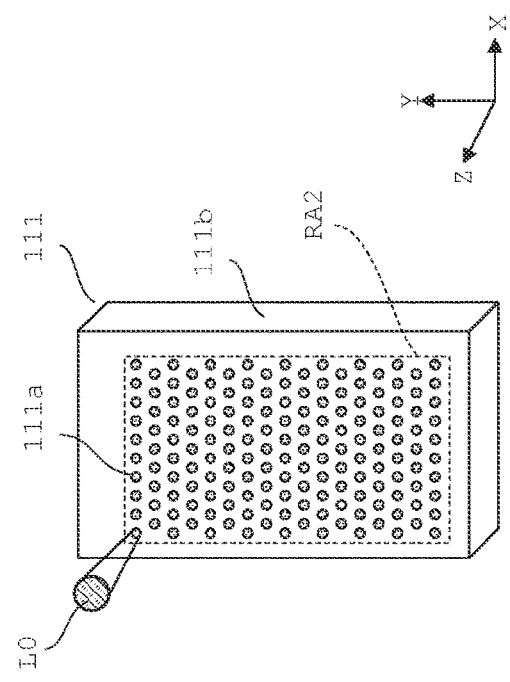
FIG. 2D schematically shows that the projection light is formed by lights from a plurality of light emitting units according to the embodiment.

As shown in FIG. 2D, the projection light L1 is formed by the lights L0 emitted from all of the light sources 111a. The lights L0 from a large number of light sources 111a overlap each other, whereby the projection light L1 has a uniform Gaussian distribution in a far field. FIG. 2C shows the intensity distribution of the projection light L1 in a far field. The intensity distribution of the projection light L1 in the far field is a Gaussian distribution that is in symmetry with respect to the emission optical axis (central axis). The intensity distribution of the projection light L1 is the same in any radial direction about the emission optical axis.

It should be noted that formation of the projection light L1 through overlapping of the lights L0 from a large number of light sources 111a also brings about an effect that the variation in the outputs and the far field patterns of the individual light sources 111a is uniformized.

Figure 3A:
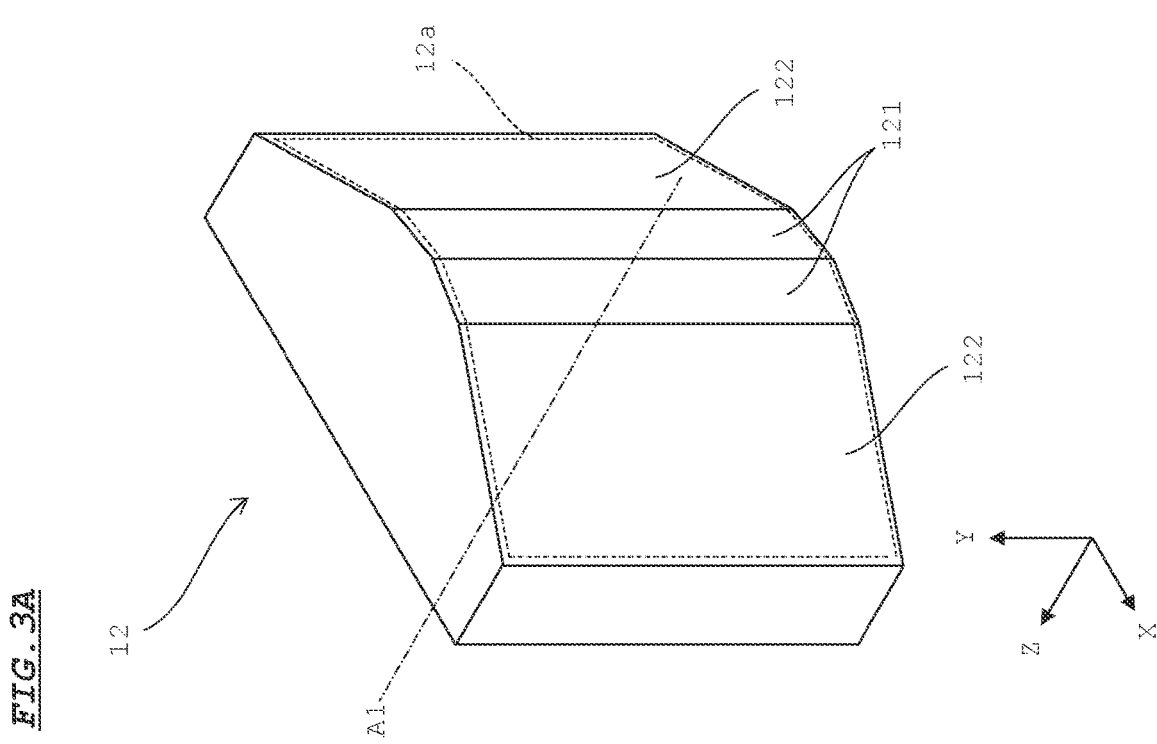
FIG. 3A to FIG. 3C are a perspective view, a top view, and a rear view, respectively, showing a configuration of an optical element according to the embodiment.
Figure 3B:
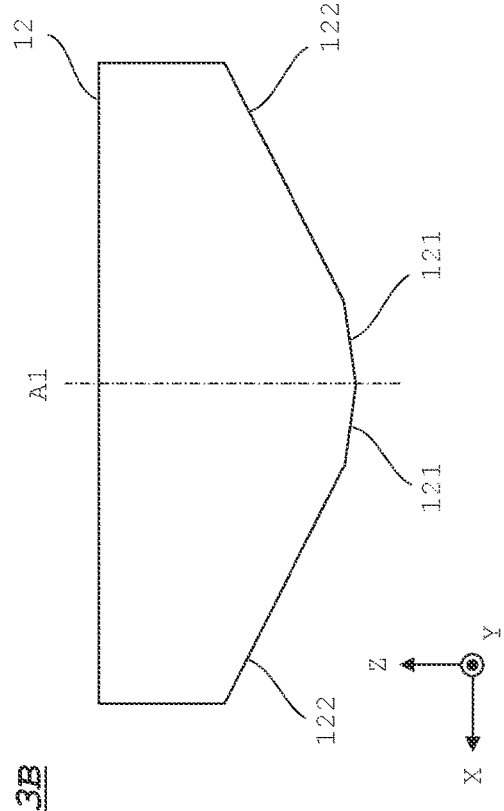
Figure 3C:
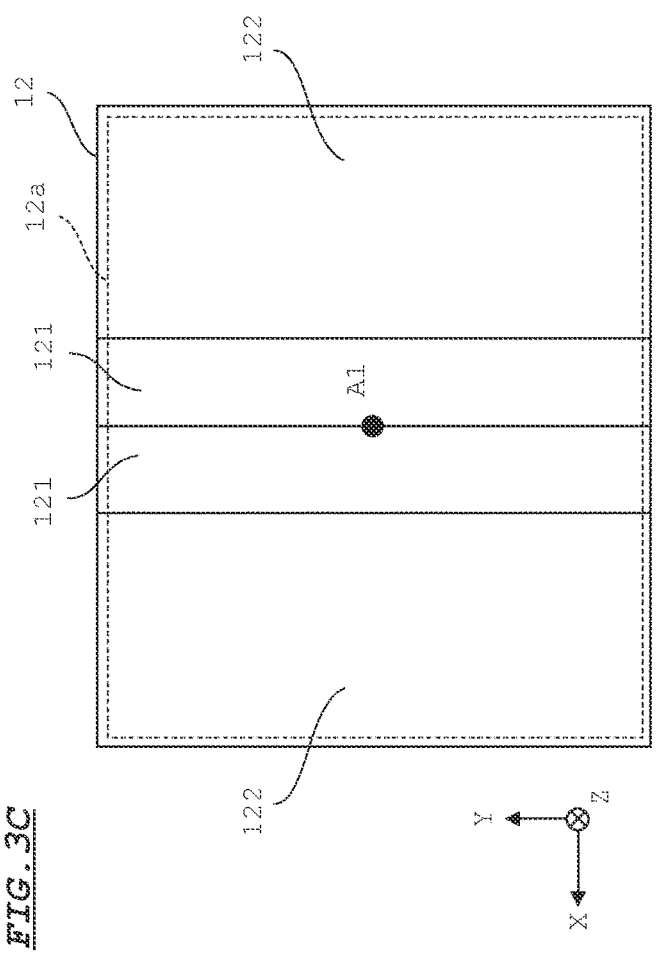

FIG. 3A to FIG. 3C are a perspective view, a top view, and a rear view, respectively, showing a configuration of the optical element 12.

The optical element 12 is formed from an optically transparent member in a prism shape. The optical element 12 is in a protruding shape in which an incident surface 12a protrudes in a Z-axis negative direction (the direction approaching the surface-emitting light source 11). The emission surface (the face on the Z-axis positive side) of the optical element 12 is a plane that is perpendicular to the Z axis. The optical element 12 is in a shape that is symmetrical in the X-axis direction. The incident surface 12a is sectioned into a plurality of regions 121, 122 in the X-axis direction (the direction in which the projection light L1 is uniformized). That is, the incident surface 12a has two regions 121 at the center, and two regions 122 disposed on the outer sides of these regions 121.

The widths in the X-axis direction of the two regions 121 are the same with each other and are constant. In addition, the widths in the X-axis direction of the two regions 122 are the same with each other and are constant. The regions 121, 122 are each implemented as a plane. The two regions 121 are tilted by the same angle, from a state of being parallel to the XY plane (a state of being parallel to the light emitting surface of the surface-emitting light source 11), to a direction parallel to the XZ plane (the direction of uniformization of the projection light L1). In addition, the two regions 122 are tilted by the same angle, from a state of being parallel to the XY plane (a state of being parallel to the light emitting surface of the surface-emitting light source 11), to a direction parallel to the XZ plane (the direction of uniformization of the projection light L1). The tilt angle of each region 122 is greater than the tilt angle of each region 121. Therefore, the region 121 and the region 122 have refractive actions different from each other in the X-axis direction (the direction of uniformization of the projection light L1).

The optical element 12 is disposed such that the incident surface 12a properly faces the light emitting surface of the surface-emitting light source 11. That is, the optical element 12 is disposed such that: a central axis A1 of the optical element 12 matches the center of the light emitting region RA1 of the surface-emitting light source 11; and the emission surface (the face on the Z-axis positive side) of the optical element 12 is parallel to the light emitting surface of the surface-emitting light source 11.

Figure 4B:
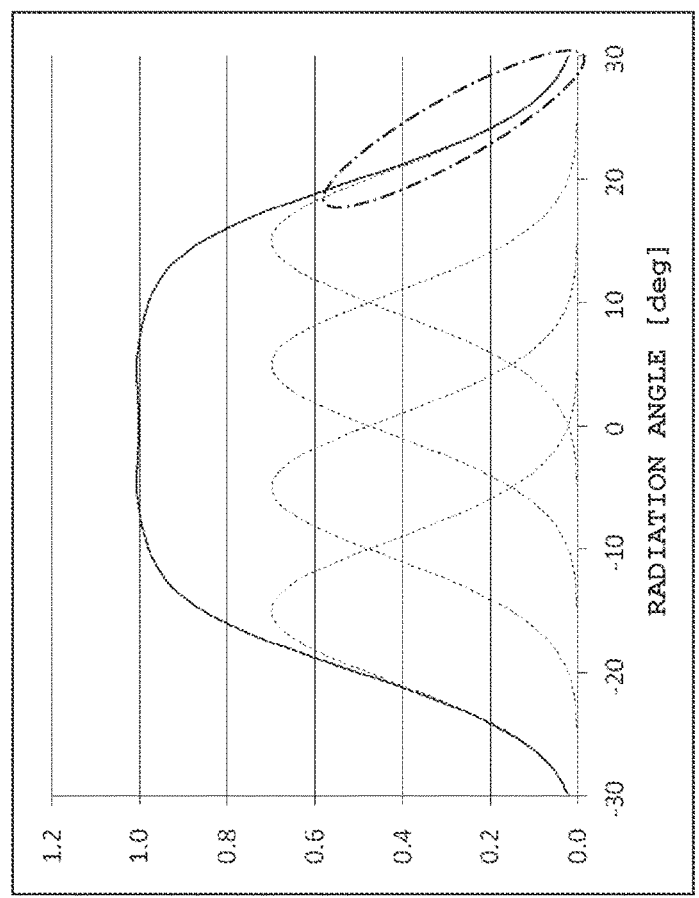
FIG. 4B is a graph showing a simulation result of the intensity distribution of the projection light in verification 1 according to the embodiment.
Figure 4A:
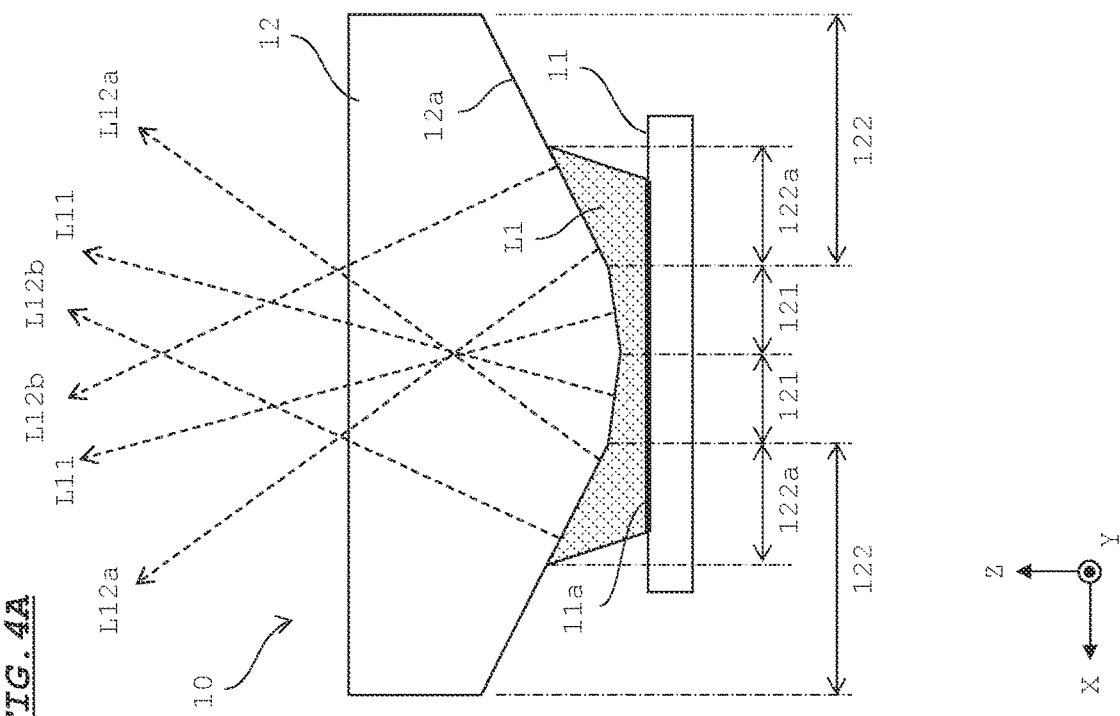
FIG. 4A schematically shows how the projection light emitted from the surface-emitting light source is refracted by the optical element according to the embodiment.

FIG. 4A schematically shows how the projection light L1 emitted from the surface-emitting light source 11 is refracted by the optical element 12.

As shown in FIG. 4A, the projection light L1 emitted from a light emitting surface 11a of the surface-emitting light source 11 is incident on the incident surface 12a so as to be evenly applied in the X-axis direction. With respect to the two regions 121, 121 at the center, the projection light L1 is incident on the entire region in the width thereof in the X-axis direction, and with respect to the two regions 122, 122 on the lateral sides, the projection light L1 is incident on partial regions 122a in the width thereof in the X-axis direction. The projection light L1 incident on the regions 121, 122a is subjected to the refractive action according to the tilt angle of each region.

Here, the surface-emitting light source 11 is formed by a large number of light sources 111a being integrated as described above. Therefore, each ray of the projection light L1 incident on the region 121, 122a enters the region, with a spread angle of light from a corresponding light source 11a. Thus, the ray incident on the region 121, 122a is refracted at a refraction angle determined by the spread angle thereof and the refractive action according to the tilt angle of the region 121, 122a. Accordingly, the travelling direction of the ray is determined.

Here, the tilt angle of the region 122a is greater than that of the region 121. Therefore, ray groups L12a, L12b incident on the regions 122a are refracted more than a ray group L11 incident on the regions 121. Therefore, the rays incident on the two regions 121 at the center form a luminous flux, of the projection light L1 after having been transmitted through the optical element 12, in an angle range corresponding to the vicinity of the center in the X-axis direction. The rays incident on the two regions 122a on the lateral sides form luminous fluxes, of the projection light L1 after having been transmitted through the optical element 12, in angle ranges corresponding to the vicinities of the outer edges in the X-axis direction.

Here, the rays incident on the two regions 122a on the lateral sides each have a different travelling direction in accordance with the spread angle at the time of emission from the light source 111a. The ray groups L12a, L12b in FIG. 4A illustrate this. The ray incident on each region 122a in a direction tilted toward the center direction of the optical element 12 with respect to the Z-axis direction is refracted by the region 122a in a direction further tilted toward the center direction of the optical element 12.

Therefore, the projection light L1 incident on the regions 122a travels in an angle range between: the ray group L12a that is most refracted among the ray groups that are incident, on the regions 122a, while being tilted toward the optical axis direction (the inner side of the optical element 12); and the ray group L12b that is least refracted among the ray groups that are incident, on the regions 122a, while being tilted in a direction (the outer side of the optical element 12) away from the optical axis direction. Therefore, the luminous fluxes in the vicinities of end portions in the X-axis direction of the projection light L1 are formed by the luminous fluxes in the vicinities of the ray group L12a.

Here, as described above, the surface-emitting light source 11 is configured such that a large number of light sources 111a are substantially evenly disposed. Therefore, each of the intensity distributions of the luminous fluxes incident from the surface-emitting light source 11 on the regions 121, 122a substantially becomes a Gaussian distribution. In addition, each region 121, 122a on which light is incident is implemented as a plane not having a curvature. Therefore, the intensity distribution in the vicinities of the outer edges in the X-axis direction of the projection light L1 reflects the intensity distribution (Gaussian distribution) of the luminous fluxes incident on the regions 122a as it is.

Thus, due to the incident surface being a plane not having a curvature, the intensity distributions (Gaussian distribution) of the luminous fluxes incident on the regions 122a are reflected, as they are, in the intensity distribution in the vicinities of the outer edges in the X-axis direction of the projection light L1, and thus, the intensity distribution in the outer edges of the projection light L1 is suppressed from becoming moderate. Accordingly, in the vicinities of the boundaries of the spread angle of the projection light L1, the intensity of the projection light L1 can be steeply increased to a uniform intensity, and as a result, the range of the uniform intensity can be widened.

<Verification 1>

The inventor verified through simulation that the intensity distribution in the vicinities of the outer edges of the projection light L1 can be steeply raised by using the optical element 12 having the above configuration. Hereinafter, the result of this verification is described.

FIG. 4B is a graph showing a simulation result of the intensity distribution of the projection light L1.

In this simulation, it was assumed that light is incident on the regions 121, 122a, in a Gaussian distribution. The full width at half maximum (FWHM) of the Gaussian distribution of the luminous flux that is transmitted through each region was set to 13.5°. The number of divisions of the incident surface 12a of the optical element 12 was 4 as in the case of FIG. 3A to FIG. 3C. Each of the four divided regions 121, 122 was implemented as a plane, as in the above. The spread angle in the X-axis direction of the projection light L1 after having been transmitted through the optical element 12 was set to 30°. The angle pitch between the region 122a and the region 121 (the angle difference between the peak intensities of the luminous fluxes having been transmitted through the respective regions) was set to 10°.

In FIG. 4B, the horizontal axis represents the radiation angle in the X-axis direction of the projection light L1, and the vertical axis represents the normalized intensity distribution of the projection light L1. The intensity distributions of the luminous fluxes having been transmitted through the regions 121, 122a are indicated by broken lines. The intensity distributions indicated by the two broken lines at the center are the intensity distributions of the luminous fluxes having been transmitted through the two regions 121, and the intensity distributions indicated by the two broken lines on the lateral sides are intensity distributions of the luminous fluxes having been transmitted through the two regions 122a. The four broken-line intensity distributions are added together, whereby the intensity distribution of the entirety of the projection light L1 indicated by a solid line is obtained.

As shown in FIG. 4B, among the intensity distributions of the luminous fluxes having been transmitted through the regions 122a, the intensity distribution on an outer side (the portion surrounded by an alternate long and short dash line) was reflected, as it was, in the intensity distribution in the vicinity of the outer edge of the projection light L1. Thus, the intensity distribution in the vicinity of the outer edge of the projection light L1 could be steeply raised to a uniform intensity distribution, and a uniform intensity distribution having a wide range could be secured. That is, it could be confirmed that, when the optical element 12 having the above configuration of the embodiment was used, while the light amount was secured by using the surface-emitting light source 11, the radiation angle of the projection light L1 could be expanded to ±30° and the intensity distribution of the projection light L1 could be uniformized in a wide range.

<Verification 2>

Next, the inventor verified, through simulation, change in the intensity distribution of the projection light L1 when the relationship between the full width at half maximum of the Gaussian distribution of the luminous fluxes transmitted through the regions 121, 122a and the angle pitch between the luminous fluxes (the angle difference between the peak intensities) was changed.

Figure 5A:
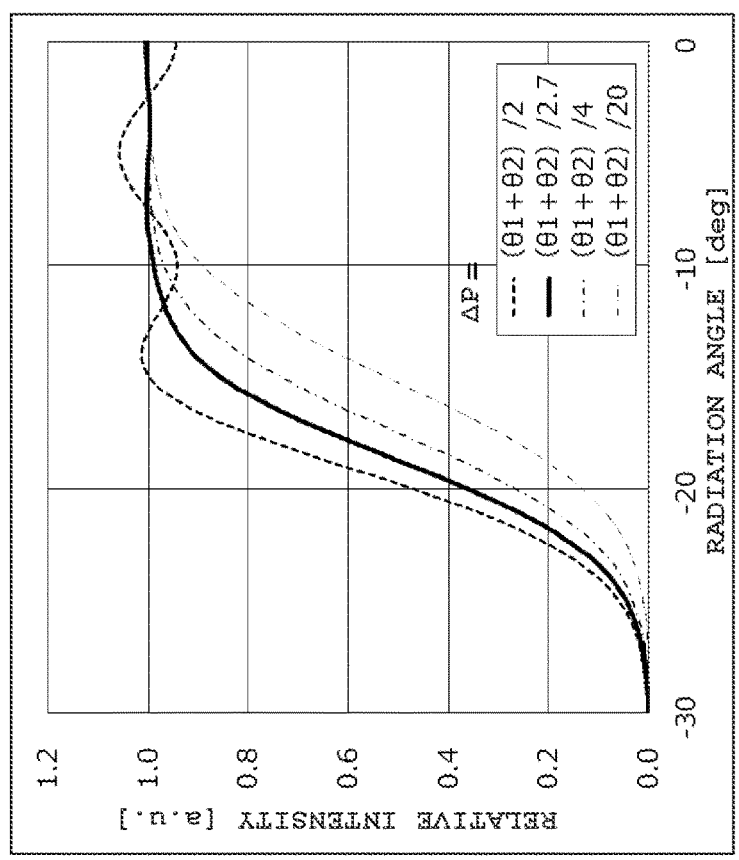
FIG. 5A is a diagram describing parameters that serve as variables in verification 2 according to the embodiment.

FIG. 5A is a diagram describing parameters that serve as variables in this verification. The graph in FIG. 5A is the same as the graph in FIG. 4B.

In FIG. 5A, $\theta1$ represents the full width at half maximum of the luminous flux having been transmitted through the region (outermost region) on the outermost side, and $\theta2$ represents the full width at half maximum of the luminous flux having been transmitted through the inner side region (adjacent region) adjacent to the outermost region. P1, P2 are the angle positions of the peak intensities of the luminous fluxes having been transmitted through the outermost region and the adjacent region, respectively. P is the angle difference (angle pitch) between the angle positions of these peak intensities.

In this verification as well, similar to verification 1 above, the spread angle (radiation angle) in the X-axis direction of the projection light L1 after having been transmitted through the optical element 12 was set to ±30°. In accordance with change in the full width at half maximum $\theta1$, $\theta2$, the number of divisions of the incident surface 12a was changed. Each divided region was implemented as a plane, as in the embodiment above. The intensity distribution of the luminous flux transmitted through each region was assumed to be a Gaussian distribution.

FIG. 6A to FIG. 6D each show a simulation result. In FIG. 6A to FIG. 6D, the contents represented by the vertical axis, the horizontal axis, the solid line, and the broken line are the same as those in FIG. 4B.

Figure 6C:
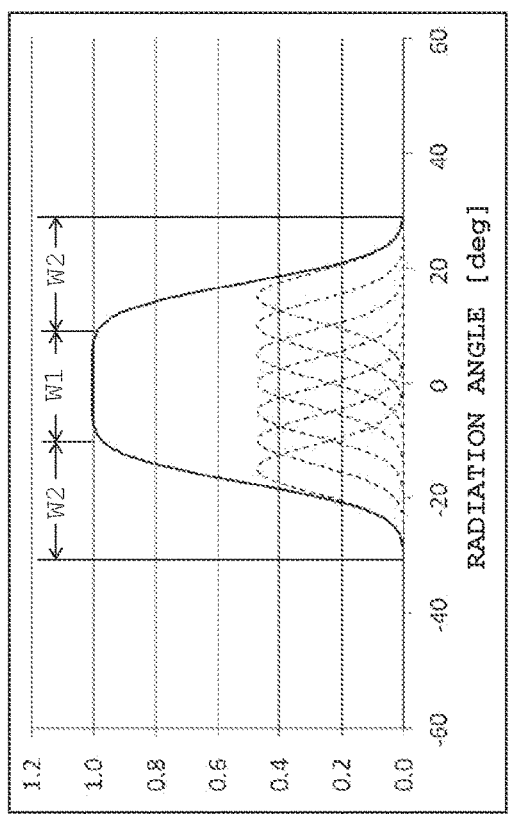
FIG. 6A to FIG. 6D are each a graph showing a simulation result of the intensity distribution of the projection light in verification 2 according to the embodiment.
Figure 6D:
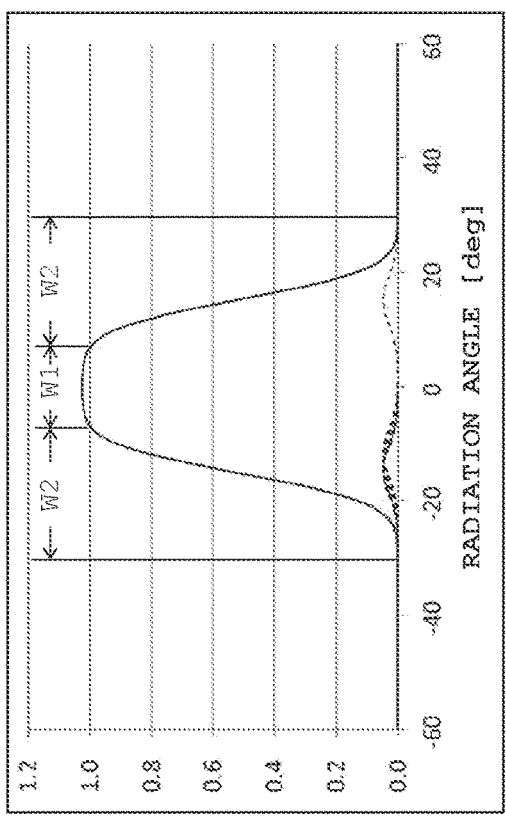
Figure 6A:
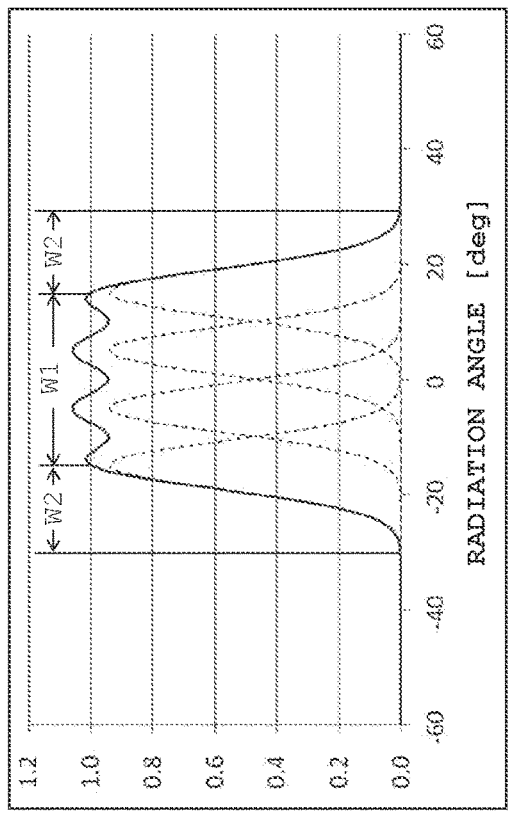

In FIG. 6A, the full width at half maximum $\theta1$, $\theta2$ was set to 10°, and the angle pitch GP was set to 10°. That is, the relationship between the angle pitch $\Delta P$ and the full width at half maximum $\theta1$, $\theta2$ was set as in the formula below.

$$\Delta P=(\theta1+\theta2)/2 \quad (1)$$

The incident surface 12a of the optical element 12 was sectioned into four regions as in the above.

In FIG. 6A, the intensity distributions (Gaussian distribution) of the luminous fluxes on the outermost sides were reflected, as they were, in the intensity distribution of the projection light L1. Thus, it could be confirmed that the intensity distribution in the outer edge ranges W2 of the projection light L1 could be steeply raised. In addition, it could be confirmed that the intensity distribution slightly varied in a uniform range W1. From this, it was understood that when the angle pitch $\Delta P$ was set to be not less than the value of formula (1) above, a problem was caused in uniformization in the uniform range W1.

Figure 6B:
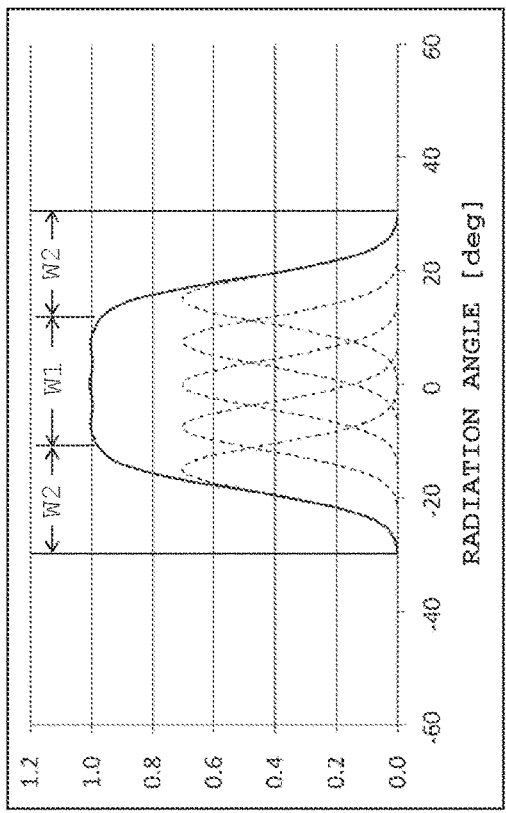

In FIG. 6B, the full width at half maximum $\theta1$, $\theta2$ was set to 10°, and the angle pitch $\Delta P$ was set to 7.5°. That is, the relationship between the angle pitch $\Delta P$ and the full width at half maximum $\theta1$, $\theta2$ was set as in the formula below.

$$\Delta P=(\theta1+\theta2)/2.7 \quad (2)$$

The incident surface 12a of the optical element 12 was sectioned into five regions. Therefore, the region at the center was parallel to the light emitting surface 11a of the surface-emitting light source 11.

In FIG. 6B as well, the intensity distributions (Gaussian distribution) of the luminous fluxes on the outermost sides were reflected, as they were, in the intensity distribution of the projection light L1. Thus, it could be confirmed that the intensity distribution of the outer edge ranges W2 of the projection light L1 could be steeply raised. In addition, variation in the intensity distribution in the uniform range W1 was markedly suppressed when compared with that in FIG. 6A. From this, it could be confirmed that when the angle pitch $\Delta P$ was set to the value according to formula (2) above, a good intensity distribution of the projection light L1 could be obtained.

In the verification result in FIG. 6B, the width of the uniform range W1 was slightly reduced when compared with that in FIG. 6A. Therefore, in order to widen the uniform range W1, it can be said that it is preferable to set the angle pitch $\Delta P$ to be close to the value according to formula (1) above.

In FIG. 6C, the full width at half maximum $\theta1$, $\theta2$ was set to 10°, and the angle pitch $\Delta P$ was set to 5°. That is, the relationship between the angle pitch $\Delta P$ and the full width at half maximum $\theta1$, $\theta2$ was set as in the formula below.

$$\Delta P=(\theta1+\theta2)/4 \quad (3)$$

The incident surface 12a of the optical element 12 was sectioned into seven regions. Therefore, the region at the center was parallel to the light emitting surface of the surface-emitting light source 11.

In FIG. 6C, the outer side ranges of the intensity distributions (Gaussian distribution) of the luminous fluxes on the outermost sides overlapped with part of the intensity distributions (Gaussian distribution) of the luminous fluxes on the inner sides thereof. Therefore, the intensity distribution in the outer edge ranges W2 of the projection light L1 became slightly moderate when compared with those in FIG. 6B. Accordingly, the outer edge ranges W2 are slightly widened, and the uniform range W1 was slightly reduced.

In FIG. 6D, the full width at half maximum $\theta1$, $\theta2$ was set to 10°, and the angle pitch $\Delta P$ was set to 0.5°. That is, the relationship between the angle pitch OP and the full width at half maximum $\theta1$, $\theta2$ was set as in the formula below.

$$\Delta P=(\theta1+\theta2)/20 \quad (4)$$

The incident surface 12a of the optical element 12 was sectioned into 61 regions. Therefore, the region at the center was parallel to the light emitting surface of the surface-emitting light source 11.

In FIG. 6D, since the number of divisions is large, the incident surface 12a is substantially equivalent to a curved surface. Under this condition, in the vicinities of the outer edges of the projection light L1, intensity distributions of a plurality of luminous fluxes overlap each other. Accordingly, the intensity distribution in the vicinities of the outer edges became moderate to a great extent. From this result, it is understood that steep intensity distribution cannot be obtained when the incident surface is a curved surface.

Figure 5B:
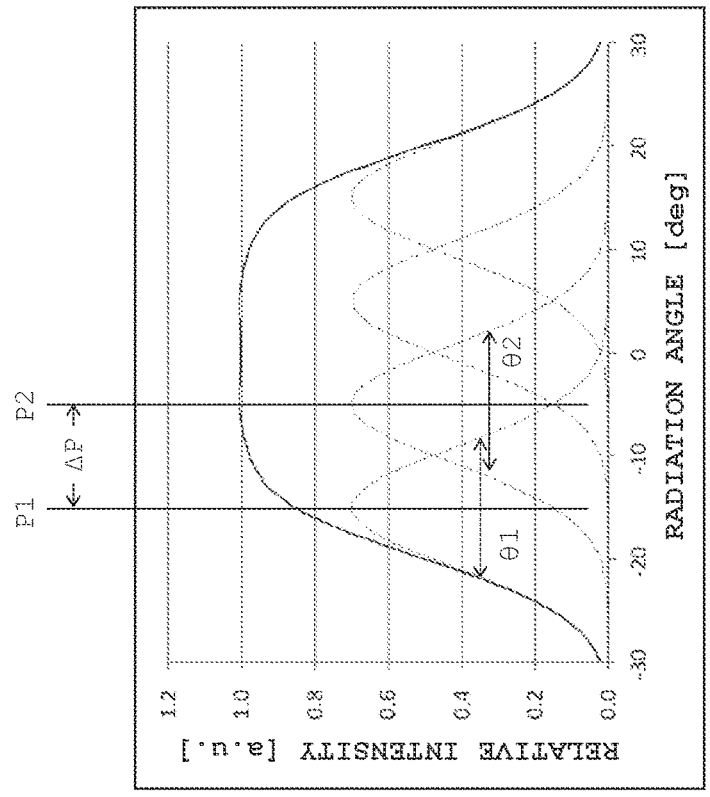
FIG. 5B is a graph showing a simulation result of the intensity distribution of the projection light in verification 2 according to the embodiment.

FIG. 5B is a graph obtained by integrating the verification results in FIG. 6A to FIG. 6D. For convenience, FIG. 5B shows the intensity distribution in the vicinity of the boundary on the left side of each graph.

From this verification result, it is understood that, when the angle pitch ΔP is set to be not less than (θ1+θ2)/4, steepness of the intensity distribution in the vicinities of the boundaries of the projection light L1 can be secured. Therefore, it can be said that that it is preferable to set the angle pitch ΔP to be not less than (θ1+θ2)/4.

In addition, from this verification result and the verification result in FIG. 6A, it is understood that, when the angle pitch ΔP exceeds (θ1+θ2)/2, uniformity of the intensity distribution in the uniform range W1 is deteriorated. Therefore, it can be said that that it is preferable to set the angle pitch ΔP to be not greater than (θ1+θ2)/2.

In verification 1 shown in FIG. 4B, the angle pitch ΔP is (θ1+θ2)/2.7. In this case as well, similar to the graph in the solid line in FIG. 5B, steepness of the intensity distribution in the vicinities of the boundaries of the projection light L1 and uniformity of the intensity distribution in the uniform range W1 can be secured.

Effects of the Embodiment

According to the present embodiment, the following effects are exhibited.

Light incident on the regions 122 (outermost regions) on the outermost sides among a plurality of regions 121, 122 set in the incident surface 12a of the optical element 12 forms the outer edges of the projection light after having been transmitted through the optical element 12. Since the regions 122 (outermost regions) are each implemented as a plane, the intensity distributions on the lateral sides of the intensity distributions (Gaussian distribution) of light incident on the regions 122 can be reflected in the intensity distribution at the outer edges of the projection light L1, as shown in FIG. 4A, for example. Accordingly, the intensity distribution at the outer edges of the projection light L1 can be suppressed from becoming moderate. Therefore, in the vicinities of the boundaries of the spread angle (radiation angle) of the projection light L1, the intensity of the projection light L1 can be steeply increased to a uniform intensity. As a result, the range of the uniform intensity (uniform range W1) can be widened. When the range of the uniform intensity is considered as being constant, light energy in the range of the uniform intensity can be increased, and as a result, light use efficiency is increased.

As described above, it is preferable that the angle pitch ΔP is set to be not less than (θ1+θ2)/4. Accordingly, steepness of the intensity distribution in the vicinities of the boundaries of the projection light L1 can be secured, and the uniform range W1 can be set so as to be wide.

As described above, it is preferable that the angle pitch ΔP is set to be not greater than (θ1+θ2)/2. Accordingly, deterioration of uniformity in the uniform range W1 can be suppressed.

In the above embodiment, the surface-emitting light source 11 is implemented as a VCSEL array in which a plurality of VCSELs are evenly disposed in the light emitting region RA1. Accordingly, the total light amount (light emission power) of the surface-emitting light source 11 can be effectively increased.

When the surface-emitting light source 11 is used as a light source, the light emitting area is increased, and thus, the energy density on the retinae of eyes is reduced. Therefore, light projection at a higher power can be performed while eye-safety is secured. In addition, in the configuration in FIG. 1, since two projection optical systems 10 are disposed so as to be separated from each other, images of the respective light sources are formed at separate positions on the retinae of eyes of a person. If the difference in the image formation positions is not less than a certain value, it is sufficient that an eye-safe condition is independently satisfied for each light source. Thus, according to this as well, light projection at a higher power can be performed while eye-safety is secured. Since two projection optical systems 10 are provided, should a deficiency occur to one of the surface-emitting light sources 11, the projection light L1 can be projected to the front region, whereby object detection can be continued.

Since the radar device 1 shown in FIG. 1 includes the projection optical systems 10 having the above configuration, the angle range (uniform range W1) in which the projection light L1 is projected in a uniform intensity distribution can be efficiently widened. Therefore, accuracy of object detection can be increased, and the ranging distance can be increased.

<Modifications 1, 2>

The configuration of the radar device 1 can be changed in various ways other than the configuration shown in the embodiment described above.

For example, in the above embodiment, two regions 121 each implemented as a plane are set in the vicinity of the center of the incident surface 12a of the optical element 12. However, a curved surface that is curved in the uniformization direction (the X-axis direction) of the projection light L1 may be set in the vicinity of the center of the incident surface 12a of the optical element 12 (hereinafter, referred to as "modification 1").

In the above embodiment, the incident surface 12a of the optical element 12 is in a protruding shape that protrudes in a direction approaching the surface-emitting light source 11. However, the incident surface 12a of the optical element 12 may be in a recessed shape that is recessed in a direction away from the surface-emitting light source 11 (hereinafter, referred to as "modification 2").

Figure 7A:
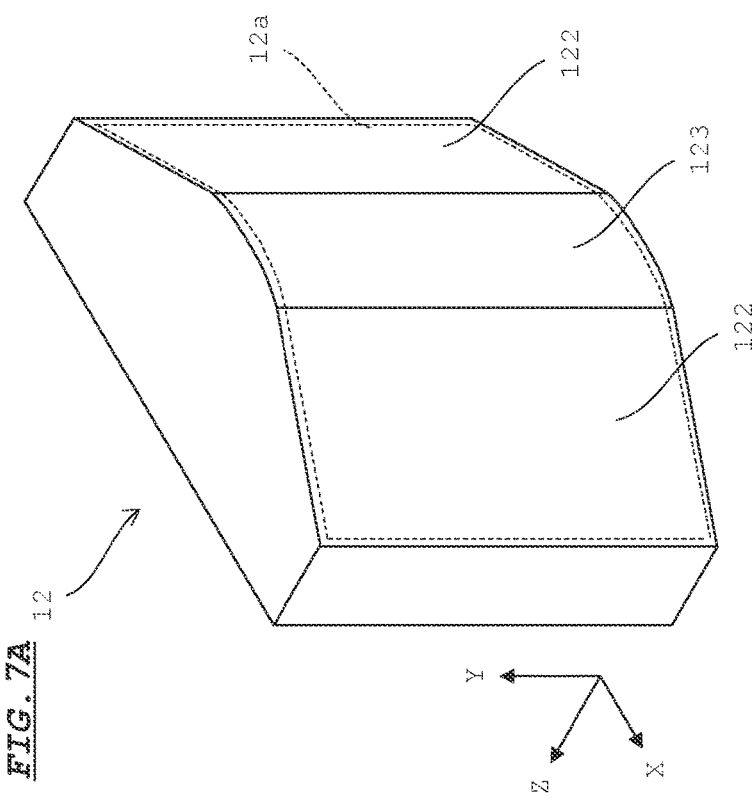
FIG. 7A and FIG. 7B are a perspective view and a top view, respectively, showing a configuration of an optical element according to modification 1.
Figure 7B:
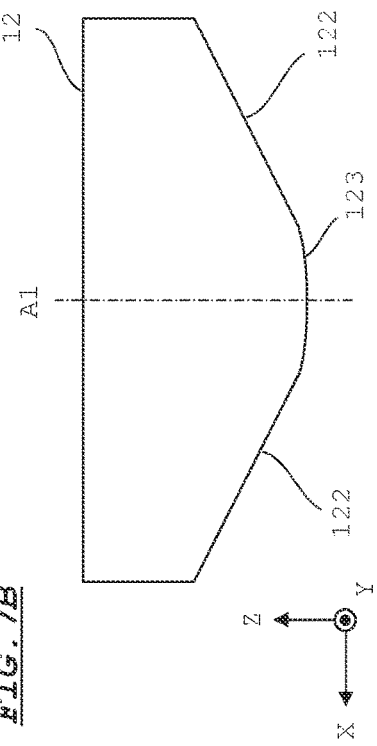
Figure 7C:
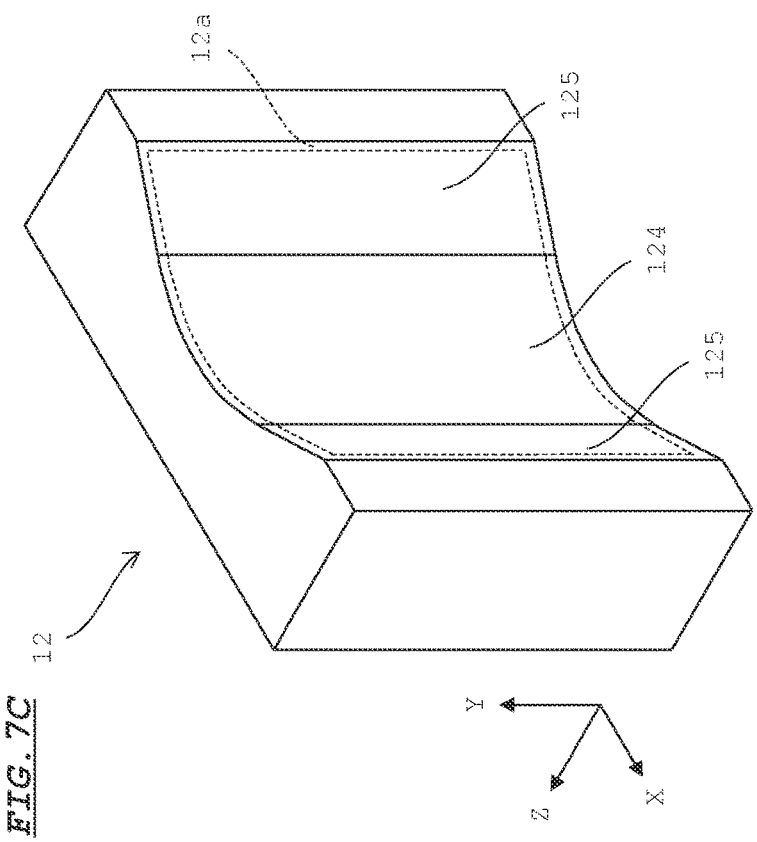
FIG. 7C and FIG. 7D are a perspective view and a top view, respectively, showing a configuration of an optical element according to modification 2.
Figure 7D:
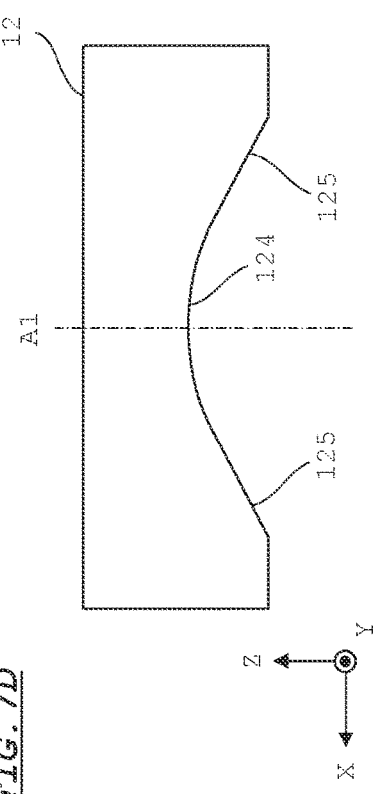

FIG. 7A and FIG. 7B are a perspective view and a plan view, respectively, showing a configuration of the optical element 12 obtained when a curved surface that is curved in the uniformization direction (the X-axis direction) of the projection light L1 is set in the vicinity of the center of the incident surface 12a, according to modification 1. FIGS. 7C, 7D are a perspective view and a plan view, respectively, showing a configuration of the optical element 12 obtained when the incident surface 12a is in a recessed shape that is recessed in a direction away from the surface-emitting light source 11, according to modification 2.

In the configuration shown in FIG. 7A and FIG. 7B, the incident surface 12a is sectioned into three regions 122, 123 in the X-axis direction. Among these, the region 123 at the center is a curved surface that is curved only in the X-axis direction. The shape of the region 123 is a cylindrical shape that is spherical or aspherical. The region 123 is in a shape that is symmetrical in the X-axis direction. The regions 122 are each a plane that is tilted in the X-axis direction, similar to the regions 122 of the above embodiment. The optical element 12 is in a shape that is symmetrical in the X-axis direction.

In the configuration shown in FIG. 7C and FIG. 7D, the incident surface 12a is sectioned into three regions 124, 125 in the X-axis direction. Among these, the region 124 at the center is a curved surface that is curved only in the X-axis direction. The shape of the region 124 is a cylindrical shape that is spherical or aspherical. The region 124 is in a shape that is symmetrical in the X-axis direction. The regions 125 are each a plane that is tilted in the X-axis direction. Here, the incident surface 12a is in a recessed shape, and thus, the two regions 125 are tilted in a direction opposite to that of the regions 122 in the above embodiment. The optical element 12 is in a shape that is symmetrical in the X-axis direction.

Figure 8A:
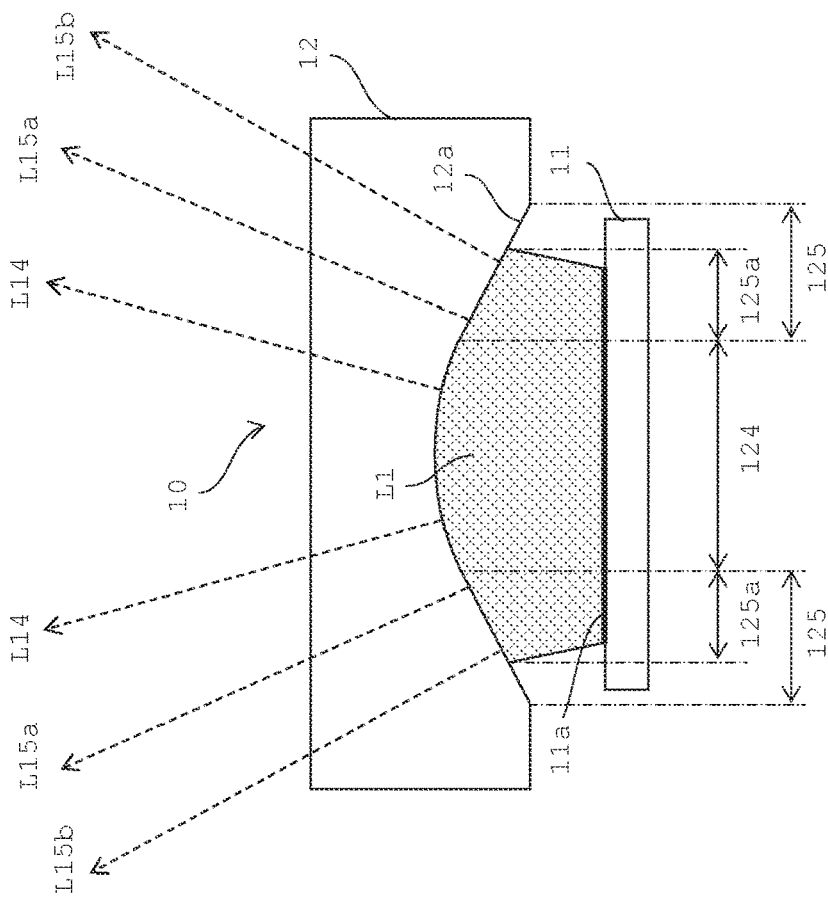
FIG. 8A and FIG. 8B schematically show how the projection light emitted from the surface-emitting light source is refracted by an optical element according to modification 1 and modification 2, respectively.
Figure 8B:
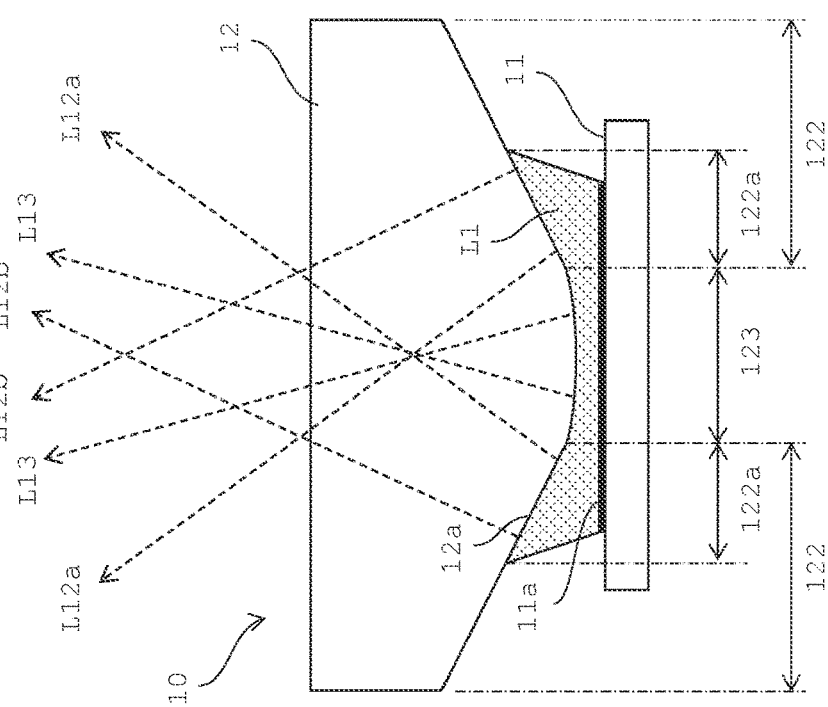

FIG. 8A schematically shows how the projection light L1 emitted from the surface-emitting light source 11 is refracted by the optical element 12 according to modification 1. FIG. 8B schematically shows how the projection light L1 emitted from the surface-emitting light source 11 is refracted by the optical element 12 according to modification 2.

With reference to FIG. 8A, the optical element 12 of modification 1 has a configuration that is equivalent to that where the two regions 121 in the configuration of FIG. 4A have been replaced with a large number of regions of which the tilt angles are gradually changed. Therefore, in this case as well, similar to the optical element 12 in FIG. 4A, the radiation angles of the ray groups L12a, L12b incident on the two regions 122a on the outer sides are greater than the radiation angle of a ray group L13 incident on the region 123 at the center. Therefore, the luminous fluxes incident on the two regions 122a form the luminous fluxes in the angle ranges corresponding to the vicinities of the outer edges in the X-axis direction of the projection light L1.

With reference to FIG. 8B, in the case of the optical element 12 of modification 2, the tilt angle of each region 125 is greater than the tilt angle of the region 124. Therefore, of the projection light L1 incident on the incident surface 12a from the surface-emitting light source 11, ray groups L15a, L15b of the luminous fluxes incident on regions 125a on the outer sides have greater radiation angles than a ray group L14 of the luminous flux incident on the region 124 at the center. Therefore, the luminous fluxes incident on the two regions 125a form the luminous fluxes in the angle ranges corresponding to the vicinities of the outer edges in the X-axis direction of the projection light L1.

As described above, in modifications 1, 2 as well, the luminous fluxes incident on the regions on the outermost sides (the two regions 122a and the two regions 125a) form the luminous fluxes in the vicinities of the outer edges of the projection light L1. Therefore, the Gaussian distributions in the outer side ranges of the luminous fluxes having been transmitted through these regions are reflected in the intensity distribution in the vicinities of the boundaries of the projection light L1. Therefore, in modifications 1, 2 as well, similar to the above embodiment, the intensity distribution in the vicinities of the boundaries of the projection light L1 can be steeply raised to a uniform intensity.

In the configuration of modification 2 shown in FIG. 7C and FIG. 7D, the region 124 may be replaced with a plurality of planes. For example, the shape of the incident surface 12a may be a shape in which the incident surface 12a shown in FIG. 3A to FIG. 3C is bent back in the Z-axis direction. In this configuration as well, the luminous fluxes incident on regions 125a on the outer edges form the luminous fluxes in the vicinities of the outer edges of the projection light L1. Therefore, similar to the case of FIG. 8B, the intensity distribution in the vicinities of the boundaries of the projection light L1 can be steeply raised to a uniform intensity.

<Verification 3>

With respect to the configuration shown in modification 1, the inventor verified, through simulation, change in the intensity distribution of the projection light L1 realized when the relationship between the full width at half maximum of the Gaussian distribution of the luminous fluxes transmitted through the regions 123, 122a and the angle pitch (the angle difference between the peak intensities) between the luminous fluxes was changed.

Figure 9B:
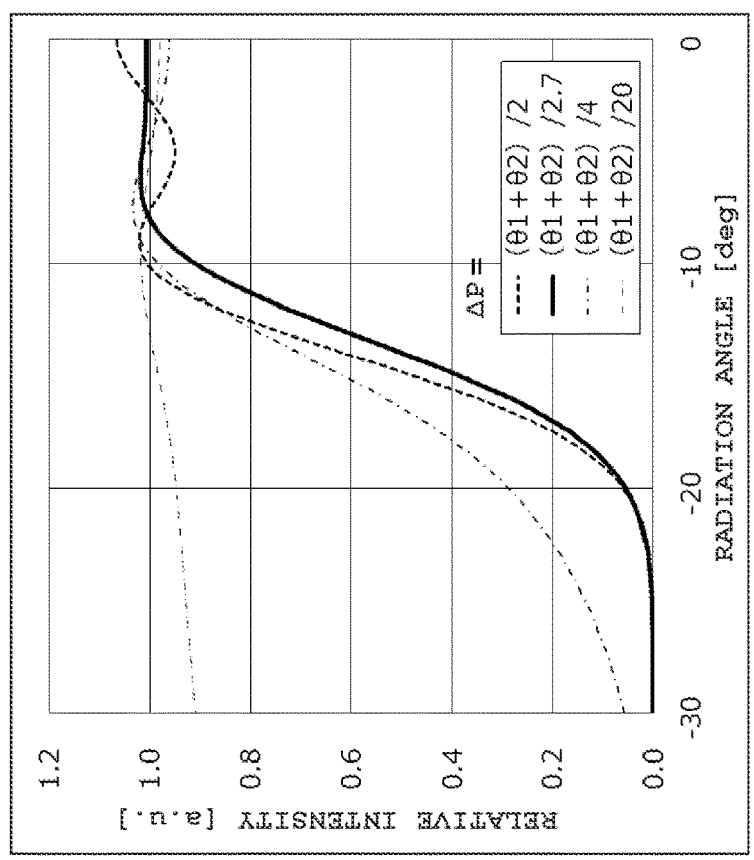
FIG. 9B is a graph showing a simulation result of the intensity distribution of the projection light in verification 3 according to modification 1.
Figure 9A:
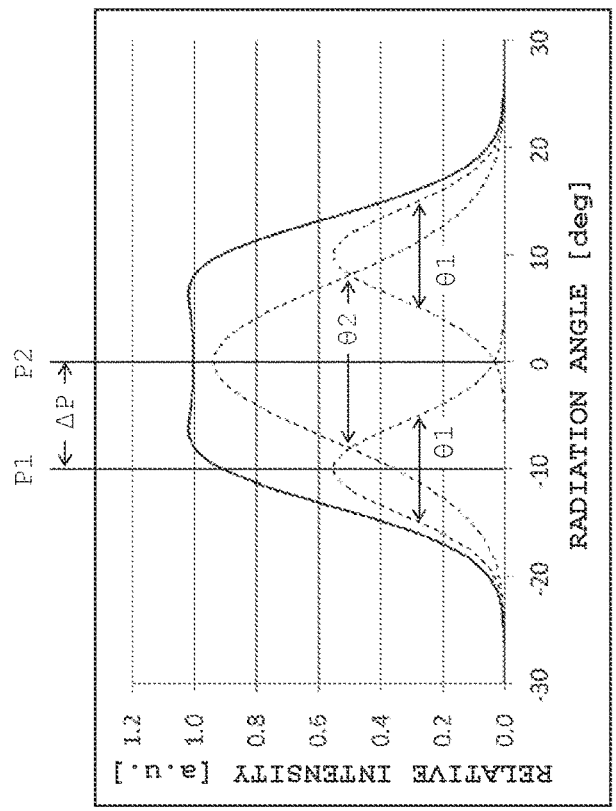
FIG. 9A is a diagram describing parameters that serve as variables in verification 3 according to modification 1.

FIG. 9A is a diagram describing parameters that serve as variables in this verification.

In FIG. 9A, the horizontal axis represents the radiation angle in the X-axis direction of the projection light L1, and the vertical axis represents the normalized intensity distribution of the projection light L1. The intensity distributions of the luminous fluxes having been transmitted through the regions 123, 122a are indicated by broken lines. The intensity distribution indicated by a broken line at the center is the intensity distribution of the luminous flux having been transmitted through the region 123, and the intensity distributions indicated by two broken lines on the lateral sides are intensity distributions of the luminous fluxes having been transmitted through the two regions 122a. The three broken-line intensity distributions are added together, whereby the intensity distribution of the entirety of the projection light L1 indicated by a solid line is obtained.

In FIG. 9A, $\theta 1$ represents the full width at half maximum of the luminous flux having been transmitted through the region (outermost region) on each of the outermost sides, and $\theta 2$ represents the full width at half maximum of the luminous flux having been transmitted through the center region (adjacent region) adjacent to the outermost regions. P1, P2 are the angle positions of the peak intensities of the luminous fluxes having been transmitted through the outermost region and the adjacent region, and $\Delta P$ is the angle difference (angle pitch) between the angle positions of these peak intensities.

In this verification as well, similar to verification 1 above, the spread angle (radiation angle) in the X-axis direction of the projection light L1 after having been transmitted through the optical element 12 was set to ±30°. The intensity distribution of the luminous flux transmitted through each region was assumed to be a Gaussian distribution. In the graph shown in FIG. 9A, the full width at half maximum $\theta 1$, $\theta 2$ are set to 10°, 17°, respectively, and the angle pitch $\Delta P$ is set to 10°. That is, the relationship of formula (2) above is present between the full width at half maximum $\theta 1$, $\theta 2$, and the angle pitch GP.

FIG. 10A to FIG. 10D each show a simulation result. In FIG. 10A to FIG. 10D, the contents represented by the vertical axis, the horizontal axis, the solid line, and the broken line are the same as those in FIG. 9A.

Figure 10C:
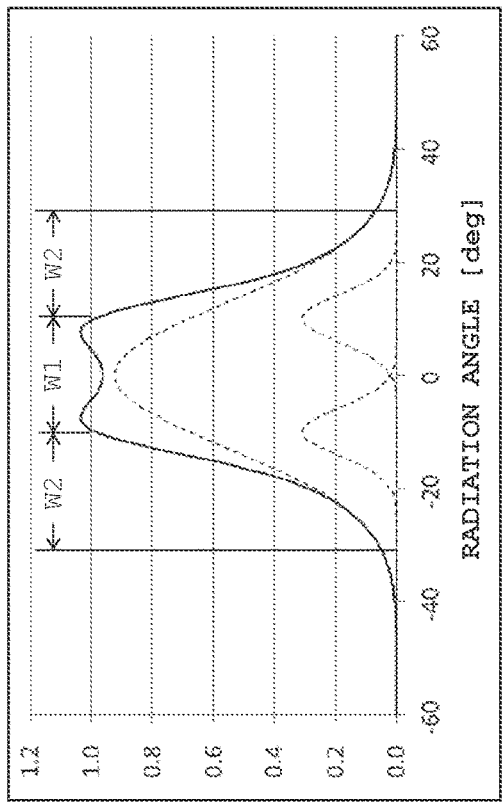
FIG. 10A to FIG. 10D are each a graph showing a simulation result of the intensity distribution of the projection light in verification 3 according to modification 1.
Figure 10D:
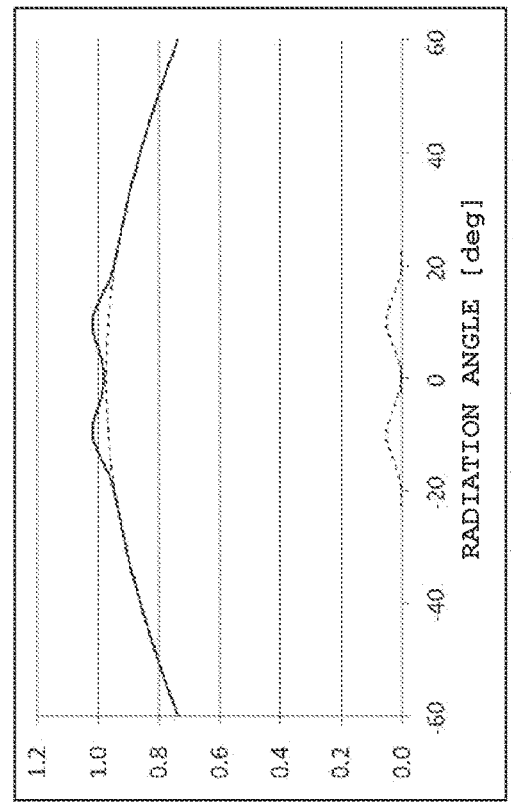
Figure 10A:
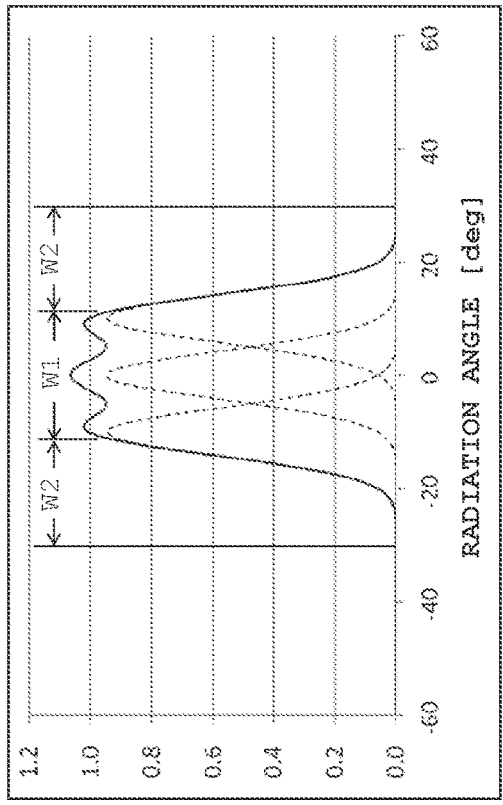

In FIG. 10A, the full width at half maximum 01, 82 was set to 10°, and the angle pitch $\Delta P$ was set to 10°. That is, the relationship between the angle pitch $\Delta P$ and the full width at half maximum $\theta 1$, $\theta 2$ was set in accordance with formula (1) above.

Figure 10B:
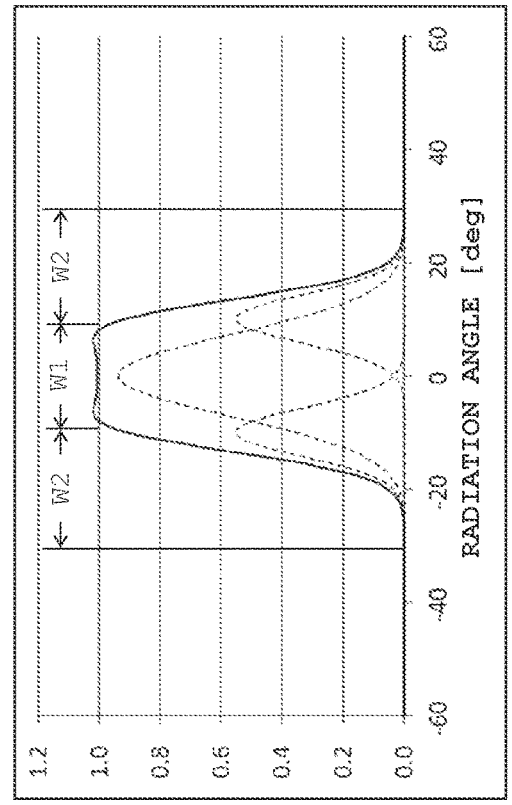

In FIG. 10B, the full width at half maximum $\theta 1$, $\theta 82$ were set to 10°, 17°, respectively, and the angle pitch $\Delta P$ was set to 10°. That is, the relationship between the angle pitch $\Delta P$ and the full width at half maximum $\theta 1$, $\theta 2$ was set in accordance with formula (2) above. The graph in FIG. 10B is the same as the graph in FIG. 9A.

In FIG. 10C, the full width at half maximum $\theta 1$, $\theta 2$ were set to 10°, 30°, respectively, and the angle pitch $\Delta P$ was set to 10°. That is, the relationship between the angle pitch $\Delta P$ and the full width at half maximum $\theta 1$, $\theta 2$ was set in accordance with formula (3) above.

In FIG. 10D, the full width at half maximum $\theta 1$, $\theta 2$ were set to 10°, 190°, respectively, and the angle pitch $\Delta P$ was set to 10°. That is, the relationship between the angle pitch ΔP and the full width at half maximum θ1, θ2 was set in accordance with formula (4) above.

In the verifications in FIG. 10A to FIG. 10C, verification results that had tendencies similar to those of the verification results in FIG. 6A to FIG. 6C in verification 2 of the above embodiment were obtained. In contrast to this, in the verification in FIG. 10D, an intensity distribution in which rises in the vicinities of the boundaries are markedly moderate when compared with the verification result in FIG. 6D in verification 2 of the above embodiment, was obtained.

FIG. 9B is a graph obtained by integrating the verification results in FIG. 10A to FIG. 10D. For convenience, FIG. 9B shows the intensity distribution in the vicinity of the boundary on the left side of each graph.

From these verifications the following could be confirmed. That is, in the configuration of modification 1 as well, when the angle pitch ΔP is set to be not less than (θ1+θ2)/4, the intensity distribution in the vicinities of the boundaries of the projection light L1 can be steeply raised, and when the angle pitch ΔP is set to be not greater than (θ1+θ2)/2, variation in the intensity distribution in the uniform range W1 of the projection light L1 can be suppressed. It can be assumed that similar verification results can be obtained also in the configuration of modification 2.

Next, the following is examined: when the distance between the surface-emitting light source 11 and the optical element 12 has been changed, what difference is caused in the intensity distribution in the vicinities of the boundaries of the projection light L1 between a case where the incident surface 12a of the optical element 12 is of a protruding type and a case where the incident surface 12a is of a recessed type.

FIG. 11A and FIG. 11B each schematically show how the projection light L1 emitted from the surface-emitting light source 11 is refracted by the optical element 12 when the distance between the surface-emitting light source 11 and the optical element 12 has been changed in the configuration (i.e., the incident surface 12a is of a protruding type) of the embodiment.

As shown in FIG. 11B, when the distance between the surface-emitting light source 11 and the optical element 12 is increased, the range (the region 122a) of a luminous flux incident on each region 122 is widened. At this time, light emitted from each light source 111a of the surface-emitting light source 11 spreads at a predetermined emission angle. Therefore, in accordance with increase in the distance between the surface-emitting light source 11 and the optical element 12, the ray group incident on the regions 122a has a greater proportion of a ray group incident while being tilted in a direction (the outer side of the optical element 12) away from the optical axis direction. Therefore, the light amount of the ray group L12a forming the vicinities of the boundaries of the projection light L1 is decreased in accordance with increase in the distance between the surface-emitting light source 11 and the optical element 12, and in association with this, the light amount of the ray group L12b is increased.

Figure 12A:
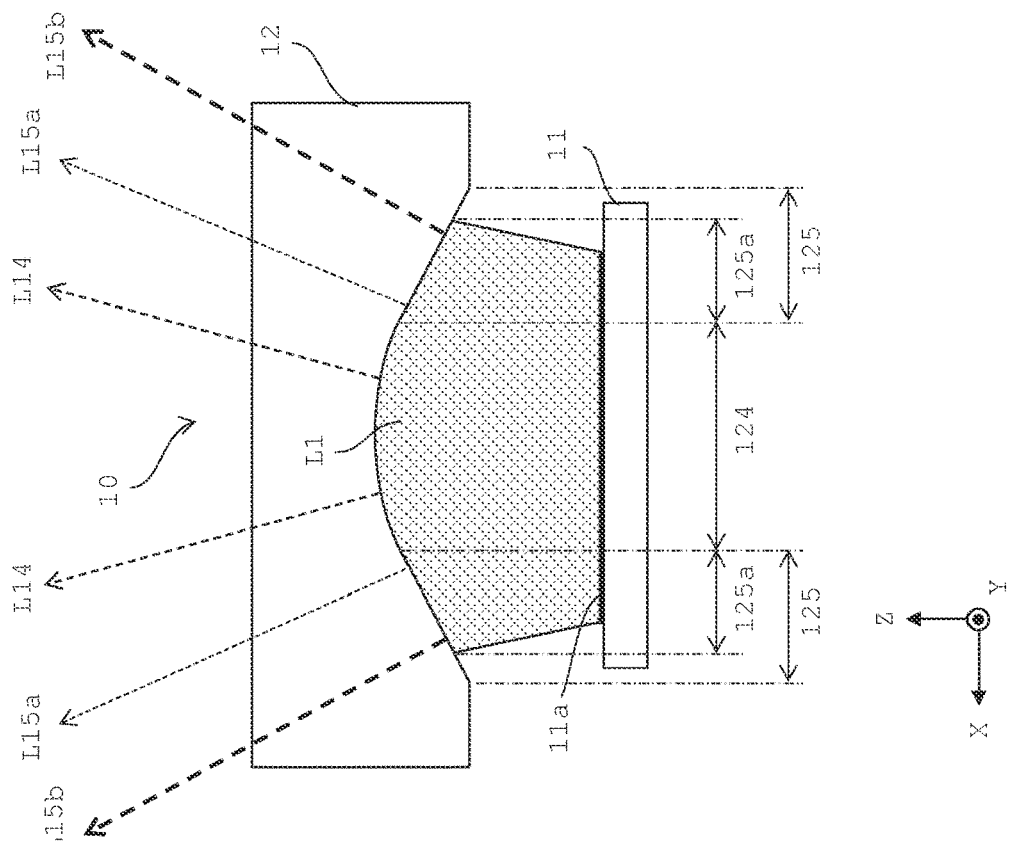
FIG. 12A schematically shows how the projection light is refracted by an optical element when the distance between the surface-emitting light source and the optical element is set to a predetermined distance according to modification 2.
Figure 12B:
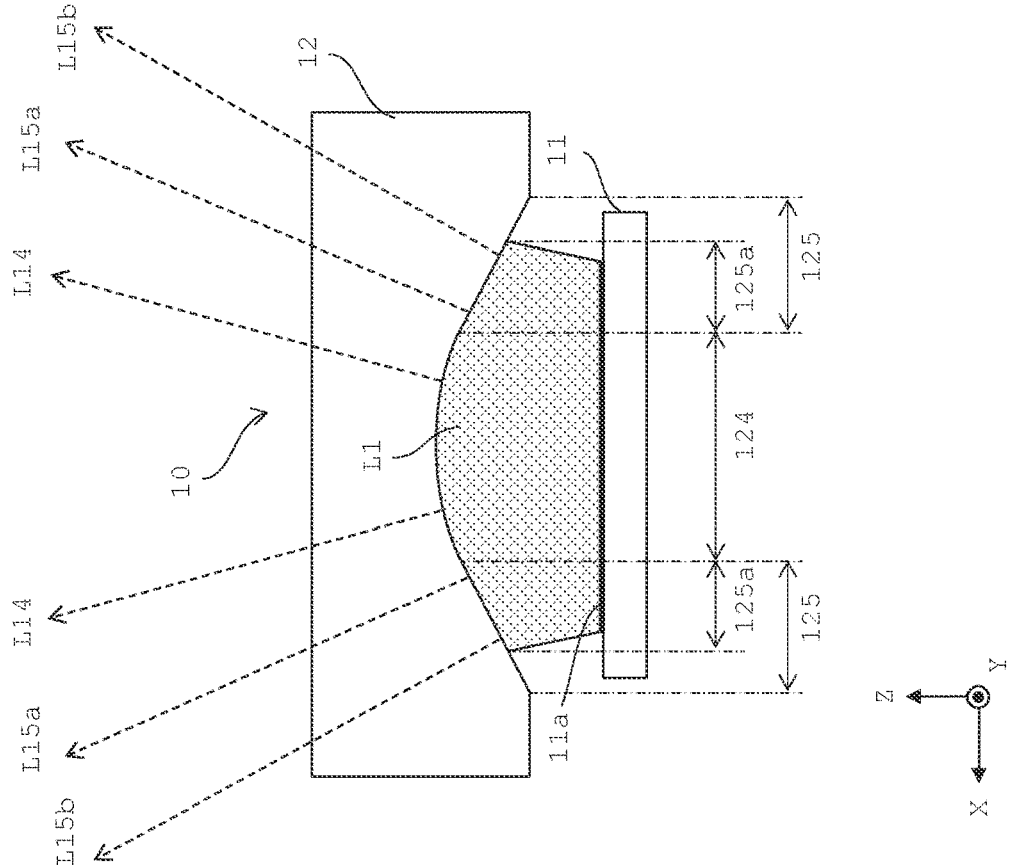
FIG. 12B schematically shows how the projection light is refracted by the optical element when the distance between the surface-emitting light source and the optical element has been increased from the predetermined distance according to modification 2.

FIG. 12A and FIG. 12B each schematically show how the projection light L1 emitted from the surface-emitting light source 11 is refracted by the optical element 12 when the distance between the surface-emitting light source 11 and the optical element 12 has been changed in the configuration (i.e., the incident surface 12a is of a recessed type) of modification 2.

As shown in FIG. 12B, when the distance between the surface-emitting light source 11 and the optical element 12 is increased, the range (the region 125a) of a luminous flux incident on each region 125 is widened. At this time, light emitted from each light source 111a of the surface-emitting light source 11 spreads at a predetermined emission angle. Therefore, in accordance with increase in the distance between the surface-emitting light source 11 and the optical element 12, the ray group incident on the regions 125a has a greater proportion of a ray group incident while being tilted in a direction (the outer side of the optical element 12) away from the optical axis direction. In modification 2, the incident surface 12a is of a recessed type. Thus, different from the configuration of the embodiment, the ray group L15b that is most refracted in the outer-side directions by the regions 125a forms the vicinities of the boundaries of the projection light L1. Therefore, in modification 2, the light amount of the ray group L15b forming the vicinities of the boundaries of the projection light L1 is increased in accordance with increase in the distance between the surface-emitting light source 11 and the optical element 12, and in association with this, the light amount of the ray group L15a is decreased.

Figure 13A:
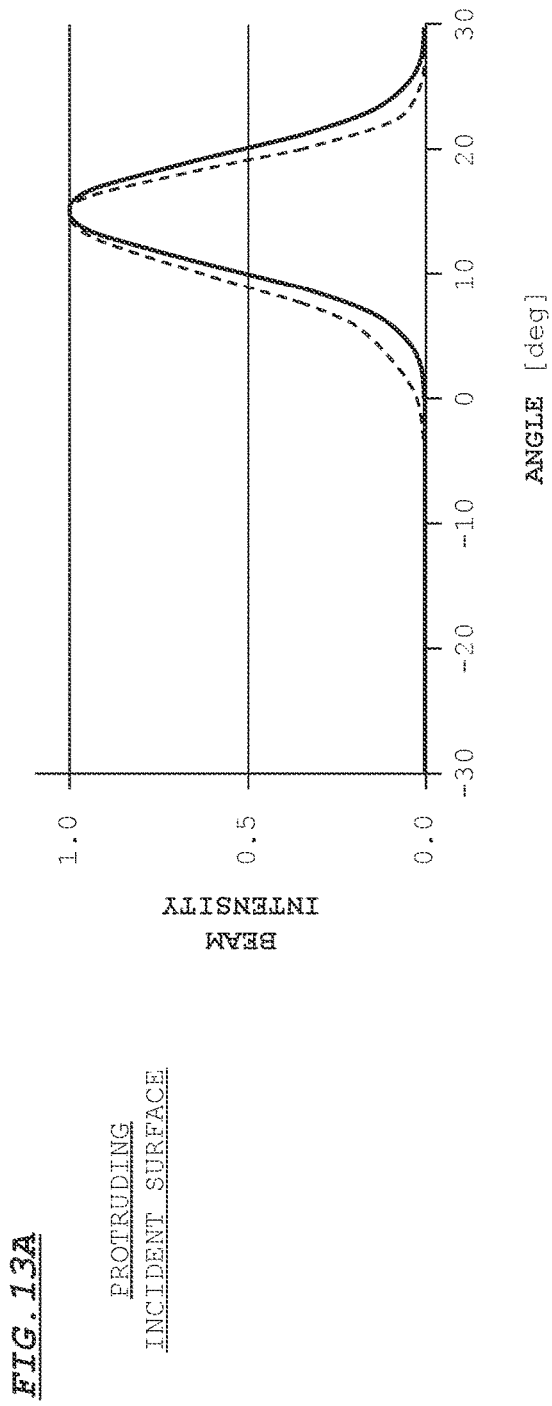
FIG. 13A and FIG. 13B are diagrams describing change in the intensity distribution of a luminous flux transmitted through an outermost region when the distance between the surface-emitting light source and the optical element has been increased in the configurations of the embodiment and modification 2, respectively.
Figure 13B:
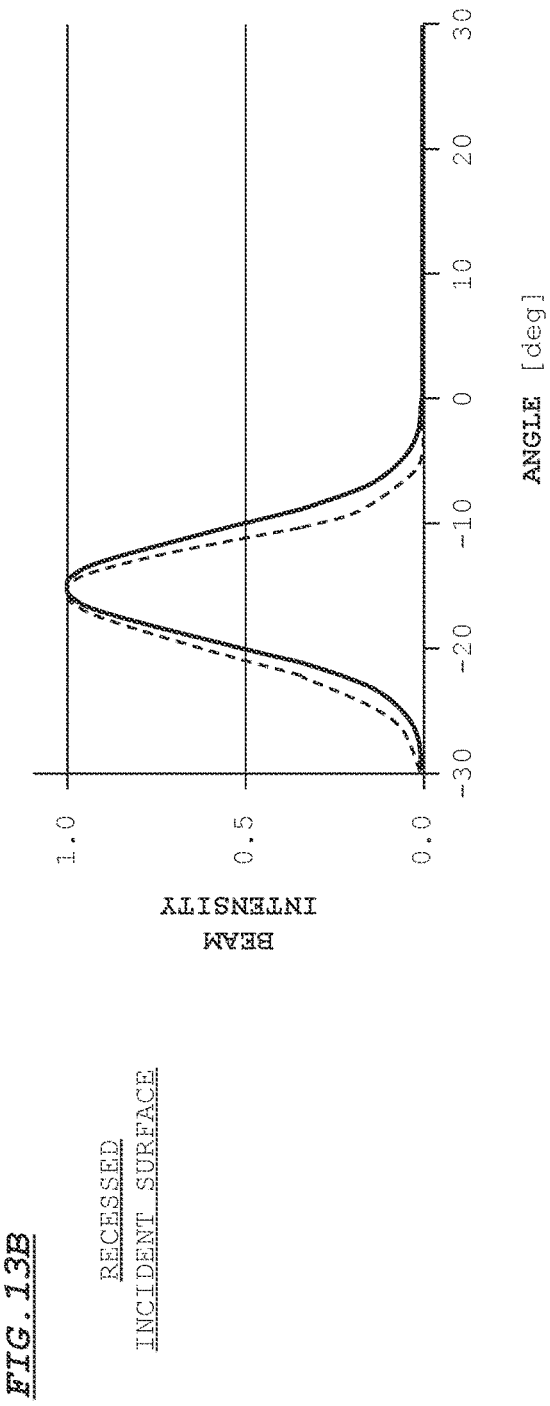

FIG. 13A and FIG. 13B are each a diagram describing change in the intensity distribution of a luminous flux that is transmitted through an outermost region when the distance between the surface-emitting light source 11 and the optical element 12 has been increased in the configurations of the embodiment and modification 2.

For convenience, FIG. 13A shows the intensity distribution of a luminous flux that has been transmitted through the region 122 on the X-axis negative side in the configuration of the embodiment, and FIG. 13B shows the intensity distribution of a luminous flux that has been transmitted through the region 125 on the X-axis positive side in the configuration of modification 2. The solid line represents the intensity distribution before the distance between the surface-emitting light source 11 and the optical element 12 has been increased, and the broken line represents the intensity distribution after the distance between the surface-emitting light source 11 and the optical element 12 has been increased.

In the configuration of the embodiment, when the distance between the surface-emitting light source 11 and the optical element 12 is increased, the light amount of the ray group L12a forming the vicinities of the boundaries of the projection light L1 is decreased, and the light amount of the ray group L12b is increased, as described above. Therefore, as shown in FIG. 13A, the intensity distribution of the luminous flux having been transmitted through the region 122 on the X-axis negative side becomes steeper in the outer side range (the range on the +30° side) and becomes more moderate in the inner side range (the range on the 0° side), due to the increase in the distance between the surface-emitting light source 11 and the optical element 12. Here, since the intensity distribution in the outer side range is reflected in the intensity distribution in the vicinity of the outer edge of the projection light L1, the intensity distribution in the vicinity of the outer edge of the projection light L1 becomes steeper in accordance with increase in the distance between the surface-emitting light source 11 and the optical element 12.

In contrast to this, in the configuration of modification 2, when the distance between the surface-emitting light source 11 and the optical element 12 is increased, the light amount of the ray group L15b forming the vicinities of the boundaries of the projection light L1 is increased, and the light amount of the ray group L15a is decreased, as described above. Therefore, as shown in FIG. 13B, the intensity distribution of the luminous flux having been transmitted through the region 125 on the X-axis positive side becomes more moderate in the outer side range (the range on the −30° side) and becomes steeper in the inner side range (the range on the 0° side), due to the increase in the distance between the surface-emitting light source 11 and the optical element 12. Here, since the intensity distribution in the outer side range is reflected in the intensity distribution in the vicinity of the outer edge of the projection light L1, the intensity distribution in the vicinity of the outer edge of the projection light L1 becomes more moderate in accordance with increase in the distance between the surface-emitting light source 11 and the optical element 12.

As described above, in the case of the configuration (the incident surface 12a is of a recessed type) of modification 2, when the optical element 12 is moved in the Z-axis positive direction from a predetermined position, steepness of the intensity distribution in the vicinities of the outer edges of the projection light L1 is reduced. In contrast to this, in the case of the configuration (the incident surface 12a is of a protruding type) of the embodiment, when the optical element 12 is moved in the Z-axis positive direction from a predetermined position, steepness of the intensity distribution in the vicinities of the outer edges of the projection light L1 can be improved.

Therefore, in the configuration of the embodiment, when the position of the optical element 12 is adjusted in the Z-axis direction, steepness of the intensity distribution in the vicinities of the outer edges of the projection light L1 can be adjusted. Therefore, according to the configuration of the embodiment, while adjustment of flatness of the uniform range W1 and correction of individual differences in the far field patterns of individual light sources 111a are performed, steepness of the intensity distribution in the vicinities of the outer edges of the projection light L1 can be set to a desired state.

Effects of Modifications 1, 2

As in modification 1, even when the region 123 at the center is a curved surface that is curved in the X-axis direction (the uniformization direction of the projection light L1), the intensity distribution in the vicinities of the outer edges of the projection light L1 can be steeply raised to a uniform intensity, and a wide uniform range W1 can be secured, as described with reference to FIG. 8A.

When FIG. 5B and FIG. 9B are compared with each other, it is understood that, when all of the regions are set as planes as in the embodiment, the boundary positions of the uniform range W1 can be set to further outer angle positions and a still wider uniform range W1 can be secured, when compared with a case where the center region is set as a curved surface as in modification 2. Therefore, in order to secure a still wider uniform range W1, it can be said that it is preferable that all of the regions of the incident surface 12a are implemented as planes.

As in the case of modification 2, even when the incident surface 12a is in a recessed shape that is recessed in a direction away from the surface-emitting light source 11, the intensity distribution in the vicinities of the outer edges of the projection light L1 can be steeply raised to a uniform intensity, and a wide uniform range W1 can be secured, as described with reference to FIG. 8B.

However, as described with reference to FIG. 11A to FIG. 13B, when the incident surface 12a is in a protruding shape as in the embodiment, steepness of the intensity distribution in the vicinities of the outer edges of the projection light L1 can be improved by adjusting the position of the optical element 12 in the Z-axis direction. Therefore, while adjustment of flatness of the uniform range W1 and correction of individual differences in the far field patterns of the individual light sources 111a are performed as appropriate, steepness of the intensity distribution in the vicinities of the outer edges of the projection light L1 can be set to a desired state. Thus, in this regard, it can be said that it is more preferable that the incident surface 12a of the optical element 12 is in a protruding shape than in a recessed shape.

Other Modifications

In the above embodiment and modifications 1, 2, the incident surface 12a is sectioned into a plurality of regions only in the X-axis direction, and among these regions, at least outermost regions are set as planes. However, this configuration may further be applied to the Y-axis direction to form the incident surface 12a. Accordingly, the projection light L1 can be uniformized in both the X-axis direction and the Y-axis direction, and the intensity distribution in the vicinities of the outer edges in both directions can be steeply raised to a uniform intensity.

In the above embodiment, two projection optical systems 10 are provided to the radar device 1. However, the number of projection optical systems 10 provided to the radar device 1 is not limited to 2. One, or three or more projection optical systems 10 may be provided to the radar device 1.

In each drawing of the above embodiment and modifications 1, 2, the tilt angle and the curvature of each region set to the incident surface 12a are merely shown for convenience of description. The tilt angle and the curvature of these regions are not limited to those shown in each drawing. The tilt angle and the curvature of each region may be set such that the intensity distribution of the projection light L1 can be steeply raised in the vicinities of the outer edges and such that flatness of the uniform range W1 can be appropriately secured.

The number of sections of the incident surface 12a is not limited to the number of sections shown in the above embodiment and modifications 1, 2. As long as the outermost regions can be set on both sides and an adjacent region can be set on the inner side thereof, the number of sections can be set to another number. The combining method of a curved surface region and a plane region is not limited to the combining method shown in the above modifications 1, 2. As long as the outermost regions on both sides are planes, another combining method may be used.

Since the area of each surface produced by sectioning the incident surface 12a has an influence on the intensity (magnitude) of the Gaussian distribution formed by the luminous flux passing through the surface, the area of each surface may be optimized to be set such that the intensity distribution obtained by combining the Gaussian distributions of light projected to the front through the respective surfaces becomes flat.

The emission surface of the optical element shown in each of the above embodiment and modifications 1, 2 is a plane that is parallel to the light emitting surface of the light source, but may be implemented as a recessed surface or protruding surface, thereby allowing an enlarging and reducing action with respect to a projection angle range.

The above description is on the assumption that each light source 11a combined to the optical element emits light in a Gaussian distribution. However, as long as the intensity distribution obtained by combining a luminous flux group projected to the front through each surface of the optical element 12 can realize a flat distribution, the intensity distribution of the light source 111a is allowed to be deviated to some extent from the Gaussian distribution.

In the above embodiment, the projection optical system 10 is applied to the radar device 1. However, the projection optical system according to the present invention can be applied as appropriate to a device that projects projection light at a uniform intensity, other than the radar device 1.

In addition to the above, various changes can be made as appropriate to the embodiment of the present invention, within the scope of the technical idea described in the claims.

What is claimed is:

1. A projection optical system comprising:
   a surface-emitting light source configured to emit light at an intensity similar to that of a Gaussian distribution; and
   an optical element configured to perform uniformization, at least in one direction and in a range of a projection angle, of the intensity of the light emitted from the surface-emitting light source, wherein
   in the optical element,
      an incident surface on which the light is incident is sectioned, in the direction in which the uniformization is performed, into a plurality of regions having refractive actions different from each other, and
      among the plurality of regions, at least outermost regions, on which outer edge portions, of the light, in the direction in which the uniformization is performed are incident, are planes that are each tilted, from a state of being parallel to a light emitting surface of the surface-emitting light source, to the direction in which the uniformization is performed, and
      when a full width at half maximum of the light that is incident on each outermost region is defined as θ1 and a full width at half maximum of the light that is incident on an adjacent region, among the plurality of regions, that is adjacent on an inner side to the outermost region is defined as θ2, an angle pitch ΔP between a peak position P1 of the light incident on the outermost region and a peak position P2 of the light incident on the adjacent region is set to be not less than (θ1+θ2)/4.

2. The projection optical system according to claim 1, wherein the angle pitch ΔP is set to be not greater than (θ1+θ2)/2.

3. The projection optical system according to claim 1, wherein
   the incident surface of the optical element is in a protruding shape that protrudes in a direction approaching the surface-emitting light source.

4. The projection optical system according to claim 1, wherein
   the incident surface of the optical element is in a recessed shape that is recessed in a direction away from the surface-emitting light source.

5. The projection optical system according to claim 1, wherein
   all of the plurality of regions are planes that are each tilted, from a state of being parallel to the light emitting surface of the surface-emitting light source, to the direction in which the uniformization is performed.

6. The projection optical system according to claim 1, wherein
   a region at a center among the plurality of regions is a curved surface that is curved in the direction in which the uniformization is performed.

7. The projection optical system according to claim 1, wherein
   the surface-emitting light source is a VCSEL array in which a plurality of VCSELs are evenly disposed in a light emitting region.

8. The projection optical system according to claim 1, wherein
   the surface-emitting light source is configured by at least one LED being disposed in a light emitting region.

9. The projection optical system according to claim 8, wherein
   the surface-emitting light source is configured by a plurality of LEDs being evenly disposed in the light emitting region.

10. A radar device comprising:
    a projection optical system; and
    a light-receiving optical system configured to receive reflection light resultant from reflection, by an object, of projection light projected from the projection optical system, wherein
    the projection optical system includes
       a surface-emitting light source configured to emit light at an intensity similar to that of a Gaussian distribution, and
       an optical element configured to perform uniformization, at least in one direction and in a range of a projection angle, of the intensity of the light emitted from the surface-emitting light source,
    in the optical element,
       an incident surface on which the light is incident is sectioned, in the direction in which the uniformization is performed, into a plurality of regions having refractive actions different from each other, and
       among the plurality of regions, at least outermost regions on which outer edge portions, of the light, in the direction in which the uniformization is performed are incident, are planes that are each tilted, from a state of being parallel to a light emitting surface of the surface-emitting light source, to the direction in which the uniformization is performed, and
    when a full width at half maximum of the light that is incident on each outermost region is defined as θ1 and a full width at half maximum of the light that is incident on an adjacent region, among the plurality of regions, that is adjacent on an inner side to the outermost region is defined as θ2, an angle pitch ΔP between a peak position P1 of the light incident on the outermost region and a peak position P2 of the light incident on the adjacent region is set to be not less than (θ1+θ2)/4.

11. The radar device according to claim 10, wherein the angle pitch ΔP is set to be not greater than (θ1+θ2)/2.

12. The radar device according to claim 10, wherein
    the incident surface of the optical element is in a protruding shape that protrudes in a direction approaching the surface-emitting light source.

13. The radar device according to claim 10, wherein
    the incident surface of the optical element is in a recessed shape that is recessed in a direction away from the surface-emitting light source.

14. The radar device according to claim 10, wherein
    all of the plurality of regions are planes that are each tilted, from a state of being parallel to the light emitting surface of the surface-emitting light source, to the direction in which the uniformization is performed.

15. The radar device according to claim 10, wherein
a region at a center among the plurality of regions is a curved surface that is curved in the direction in which the uniformization is performed.
16. The radar device according to claim 10, wherein
the surface-emitting light source is a VCSEL array in which a plurality of VCSELs are evenly disposed in a light emitting region.
17. The radar device according to claim 10, wherein
the surface-emitting light source is configured by at least one LED being disposed in a light emitting region.
18. The radar device according to claim 17, wherein
the surface-emitting light source is configured by a plurality of LEDs being evenly disposed in the light emitting region.

* * * * *